United States Patent
Oda et al.

(10) Patent No.: US 9,617,451 B2
(45) Date of Patent: Apr. 11, 2017

(54) ADHESIVE COMPOSITION AND ADHESIVE FILM HAVING SAME, SUBSTRATE PROVIDED WITH ADHESIVE COMPOSITION, AND SEMICONDUCTOR DEVICE AND METHOD FOR MANUFACTURING SAME

(71) Applicant: TORAY INDUSTRIES, INC., Tokyo (JP)

(72) Inventors: Takuro Oda, Otsu (JP); Daisuke Kanamori, Otsu (JP); Toshihisa Nonaka, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 15/111,265

(22) PCT Filed: Jan. 9, 2015

(86) PCT No.: PCT/JP2015/050483
§ 371 (c)(1),
(2) Date: Jul. 13, 2016

(87) PCT Pub. No.: WO2015/107990
PCT Pub. Date: Jul. 23, 2015

(65) Prior Publication Data
US 2016/0340558 A1 Nov. 24, 2016

(30) Foreign Application Priority Data
Jan. 15, 2014 (JP) ................................. 2014-004843

(51) Int. Cl.
*C09J 9/02* (2006.01)
*C09D 163/00* (2006.01)
*C09J 7/02* (2006.01)
*C09J 179/08* (2006.01)
*H01L 23/00* (2006.01)
*H01L 21/683* (2006.01)
*H01L 25/065* (2006.01)
(Continued)

(52) U.S. Cl.
CPC .............. *C09J 9/02* (2013.01); *C08G 73/106* (2013.01); *C09D 163/00* (2013.01); *C09J 7/02* (2013.01); *C09J 7/026* (2013.01); *C09J 7/0296* (2013.01); *C09J 163/00* (2013.01); *C09J 179/08* (2013.01); *H01L 21/6836* (2013.01); *H01L 24/16* (2013.01); *H01L 24/27* (2013.01); *H01L 24/29* (2013.01); *H01L 24/32* (2013.01); *H01L 24/81* (2013.01); *H01L 24/83* (2013.01); *H01L 24/92* (2013.01); *H01L 25/0657* (2013.01); *H01L 25/50* (2013.01); *C08G 2170/00* (2013.01); *C08K 3/0033* (2013.01); *C09J 2203/326* (2013.01); *C09J 2205/102* (2013.01); *C09J 2463/00* (2013.01); *C09J 2479/00* (2013.01); *H01L 23/293* (2013.01); *H01L 24/13* (2013.01); *H01L 24/94* (2013.01); *H01L 2221/68327* (2013.01); *H01L 2221/68377* (2013.01); *H01L 2224/1134* (2013.01); *H01L 2224/1146* (2013.01); *H01L 2224/131* (2013.01); *H01L 2224/13147* (2013.01); *H01L 2224/16145* (2013.01); *H01L 2224/16227* (2013.01); *H01L 2224/271* (2013.01); *H01L 2224/27003* (2013.01); *H01L 2224/27436* (2013.01); *H01L 2224/293* (2013.01); *H01L 2224/2929* (2013.01); *H01L 2224/29387* (2013.01); *H01L 2224/29499* (2013.01); *H01L 2224/32145* (2013.01); *H01L 2224/32225* (2013.01); *H01L 2224/73104* (2013.01); *H01L 2224/73204* (2013.01); *H01L 2224/81191* (2013.01); *H01L 2224/81204* (2013.01); *H01L 2224/81801* (2013.01); *H01L 2224/81907* (2013.01); *H01L 2224/83191* (2013.01); *H01L 2224/83192* (2013.01);
(Continued)

(58) Field of Classification Search
CPC .. C09J 9/02; C09J 7/02; C08G 73/106; C09D 163/00
See application file for complete search history.

(56) References Cited

U.S. PATENT DOCUMENTS

| | | | |
|---|---|---|---|
| 2009/0123747 A1 | 5/2009 | Fujimaru et al. | |
| 2011/0184091 A1* | 7/2011 | Mizuki | C08G 59/4238 523/428 |
| 2013/0323994 A1* | 12/2013 | Kiyoyanagi | C08G 59/4246 442/175 |

FOREIGN PATENT DOCUMENTS

| | | |
|---|---|---|
| JP | 2002-129126 A | 5/2002 |
| JP | 2004-319823 A | 11/2004 |

(Continued)

OTHER PUBLICATIONS

International Search Report issued in PCT/JP2015/050483, dated Mar. 24, 2015.
(Continued)

*Primary Examiner* — Errol Fernandes
(74) *Attorney, Agent, or Firm* — Birch, Stewart, Kolasch & Birch, LLP

(57) ABSTRACT

The present invention provides an adhesive composition having excellent strength in a cracked state, and is an adhesive composition characterized by containing a polyimide (A), a polyfunctional epoxy compound (B), an epoxy curing agent (C), and inorganic particles (D), the ratio of the polyimide (A) in a nonvolatile organic component being 3.0 wt % or more and 30 wt % or less, the ratio of the epoxy curing agent (C) in the nonvolatile organic component being 0.5 wt % or more and 10 wt % or less, and T/M being 400 or more and 8000 or less, where T is the total number of grams of the nonvolatile organic component, and M is the number of moles of epoxy groups in the nonvolatile organic component.

10 Claims, No Drawings

(51) Int. Cl.
  H01L 25/00      (2006.01)
  *C08G 73/10*    (2006.01)
  *C09J 163/00*   (2006.01)
  C08K 3/00       (2006.01)
  H01L 23/29      (2006.01)
  H05K 3/32       (2006.01)

(52) U.S. Cl.
  CPC .................. *H01L 2224/83193* (2013.01); *H01L 2224/83204* (2013.01); *H01L 2224/83862* (2013.01); *H01L 2224/83907* (2013.01); *H01L 2224/9211* (2013.01); *H01L 2224/94* (2013.01); *H01L 2225/06513* (2013.01); *H05K 3/321* (2013.01)

(56)      References Cited

FOREIGN PATENT DOCUMENTS

| | | |
|---|---|---|
| JP | 2006-342287 A | 12/2006 |
| JP | 2013-35881 A | 2/2013 |
| WO | WO 2006/132165 A1 | 12/2006 |

OTHER PUBLICATIONS

Written Opinion of ther International Searching Authority issued in PCT/JP2015/050483 (PCT/ISA/237), dated Mar. 24, 2015.

\* cited by examiner

ADHESIVE COMPOSITION AND ADHESIVE FILM HAVING SAME, SUBSTRATE PROVIDED WITH ADHESIVE COMPOSITION, AND SEMICONDUCTOR DEVICE AND METHOD FOR MANUFACTURING SAME

TECHNICAL FIELD

The present invention relates to an adhesive composition which can be used to bond electronic parts or heat dissipation plates used in, for example, personal computers and portable terminals to a printed board or a flexible board and to bond boards to each other, or which can be used to protect a wafer. More particularly, the present invention relates to an adhesive composition which are used in bonding or directly electrically connecting a semiconductor chip such as IC or LSI to a circuit board such as a flexible board, a glass epoxy board, a glass board, a ceramic board, or a silicon interposer, bonding semiconductor chips to each other, and in semiconductor chip lamination such as three-dimensional packaging. Further, the present invention relates to an adhesive film having the adhesive composition of the present invention, a substrate provided with the adhesive composition, a semiconductor device and a method for producing thereof.

BACKGROUND ART

With rapid growth of electronic terminal equipment in recent years, the electronic equipment is downsized, made thinner and becomes high performance. A semiconductor device mounted therein is downsized and densified in association with this, and flip-chip mounting is rapidly spread as a method of mounting a semiconductor chip on a circuit board.

In order to enhance reliability of the semiconductor device, an underfill material is filled in a gap between the chip and the board. As a method of filling the underfill material, a method of filling the underfill material in a gap between the chip and the board by use of a capillary phenomenon is common; however, there are problems that an unfilled state easily occurs and production cost is high. As a technique for solving these problems, a technique of forming an underfill material on a wafer and bonding an individualized chip to aboard is contrived. A method of forming an underfill, material on a wafer includes a method of forming a resin composition applied in the form of a film on a wafer through vacuum thermally laminating treatment or the like, and a method of directly applying a resin coating material to be formed on a wafer.

As described above, storage stability at room temperature and properties curing in a short time are required of the coating agent for forming a resin layer on a wafer, and high strength is required of a cured product. It is common to use an epoxy composition as these materials; however, the epoxy composition has a problem that strength is low although it is characterized by having excellent adhesiveness. Therefore, as a method of improving this problem, a resin composition having a polyimide mixed therein is reported. (for example, Patent Document 1, Patent Document 2).

PRIOR ART DOCUMENTS

Patent Documents

Patent Document 1: Japanese Patent Laid-open Publication No. 2009-277818

Patent Document 2: Japanese Patent Laid-open Publication No. 2007-211246

SUMMARY OF THE INVENTION

Problems to be Solved by the Invention

However, the resin composition in Patent Document 1 or Patent Document 2 has a problem concerning the strength in a cracked state. In view of such situations, it is an object of the present invention to provide an adhesive composition which is excellent in strength in a cracked state.

Solutions to the Problems

That is, the present invention pertains to an adhesive composition including a polyimide (A), a polyfunctional epoxy compound (B), an epoxy curing agent (C), and inorganic particles (D), wherein the ratio of the polyimide (A) in a nonvolatile organic component is 3.0 wt % or more and 30 wt % or less, the ratio of the epoxy curing agent (C) in the nonvolatile organic component is 0.5 wt % or more and 10 wt % or less, and T/M is 400 or more and 8000 or less when the total number of grams of the nonvolatile organic component is denoted by T, and the number of moles of epoxy groups in the nonvolatile organic component is denoted by M.

Effects of the Invention

According to the present invention, it is possible to obtain an adhesive composition having excellent strength in a cracked state.

EMBODIMENTS OF THE INVENTION

An adhesive composition of the present invention includes a polyimide (A), a polyfunctional epoxy compound (B), an epoxy curing agent (C), and inorganic particles (D), wherein the ratio of the polyimide (A) in a nonvolatile organic component is 3.0 wt % or more and 30 wt % or less, the ratio of the epoxy curing agent (C) in the nonvolatile organic component is 0.5 wt % or more and 10 wt % or less, and T/M is 400 or more and 8000 or less when the total number of grams of the nonvolatile organic component is denoted by T, and the number of moles of epoxy groups in the nonvolatile organic component is denoted by M. The nonvolatile organic component referred to herein refers to an organic chemical material not resulting in weight loss of 5% or more when performing thermogravimetric measurement at 200° C. for 1 hour.

The adhesive composition of the present invention contains a polyimide (A). Since the polyimide (A) has an imide ring, it has excellent heat resistance and excellent chemical resistance. In particular, use of a polyimide having on its side chain at least one functional group capable of reacting with an epoxy group promotes the ring opening of the polyfunctional epoxy compound (B) and an addition reaction to the polyimide (A) during heating treatment to enable to attain a composition having a network structure of even higher density. Examples of the functional group capable of reacting with an epoxy group include a phenolic hydroxyl group, a sulfonic acid group, and a thiol group. Examples of the method of synthesizing such a polyimide (A) include, but not limited to, a method in which an acid dianhydride having a group capable of reacting with an epoxy group and a diamine are first reacted to synthesize a polyimide precursor, and the polyimide precursor is end-modified using a primary monoamine as a terminal blocking agent and subsequently subjected to heat treatment at 150° C. or higher to cause polyimide cyclization. Other methods include a method in which after an acid dianhydride is reacted with a primary monoamine as a terminal blocking agent, a diamine is added to synthesize an end-modified polyimide precursor, and polyimide cyclization of the end-modified polyimide precursor is further performed at a high temperature of 150° C. or higher.

A preferred example of the polyimide (A) used in the present invention is a polyimide having a structure represented by a general formula (2) or a general formula (3) and having a structure represented by a general formula (1) as $R^4$ in the general formula (2) or the general formula (3) in an amount of 5 wt % or more and 15 wt % or less with respect to the total amount of a polymer. By setting the amount to 5 wt % or more, it is possible to impart more moderate flexibility to a rigid polyimide, and by setting the amount to 15 wt % or less, it is possible to maintain rigidity of a polyimide skeleton and to keep heat resistance and insulating properties more.

In addition, herein, the total amount of the polymer (polyimide) obtained by the synthesis of polyimide refers to a weight obtained by polymerization of constituents including a diamine, an acid dianhydride and a terminal blocking agent, and the weight of a polyimide does not include a diamine, an acid dianhydride and a terminal blocking agent which are respectively excessively charged in synthesizing a polyimide.

[Chemical Formula 1]

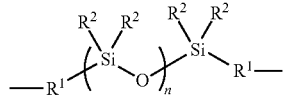

(1)

In the above formula, $R^1$ is a divalent hydrocarbon group. $R^1$ is preferably an alkylene group having 1 to 5 carbon atoms or a phenylene group. $R^2$ is a monovalent hydrocarbon group. $R^2$ is preferably an alkyl group having 1 to 5 carbon atoms or a phenyl group. $R^1$ and $R^2$ having different structures may be contained in a molecule of the polyimide, or $R^1$ and $R^2$ having different structures may be contained in different polyimide molecules.

n represents an integer of 1 to 10, and is preferably 1 to 2. By setting n to 1 or more, it is possible to suppress the shrinkage of the adhesive composition during curing, and by setting n to 10 or less, it is possible to improve insulating properties and heat resistance of the adhesive composition without reducing an imide-group content in the polyimide skeleton.

[Chemical Formula 2]

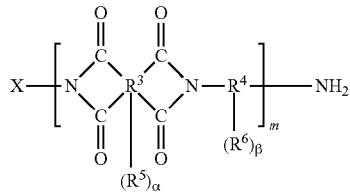

(2)

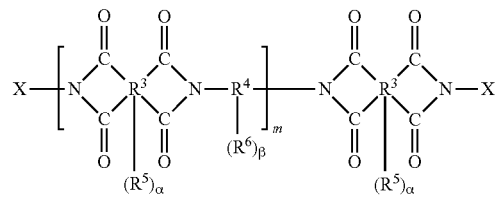

(3)

In the above formula, $R^3$ is a tetra- to 14-valent organic group, $R^4$ is a di- to 12-valent organic group, and at least one of $R^3$ and $R^4$ contains at least one group selected from the group consisting of a 1,1,1,3,3,3-hexafluoropropyl group, an isopropyl group, an ether group, a thioether group and a $SO_2$ group (hereinafter, the group selected from this group is referred to as "specific group"). Further, $R^3$ and $R^4$ preferably contain an aromatic group. $R^5$ and $R^6$ each represent an organic group having at least one group selected from the group consisting of a phenolic hydroxyl group, a sulfonic acid group and a thiol group. $R^3$ to $R^6$ having different structures may be contained in a molecule of the polyimide, or $R^3$ to $R^6$ having different structures may be contained in different polyimide molecules. X represents a monovalent organic group. m is 8 to 200. α and β each represent an integer of 0 to 10 and α+β is an integer of 0 to 10. However, 20 to 90% of the structural units whose repeating number is m show α+β=1 to 10.

In addition, the polyimide (A) used in the present invention is preferably an organic-solvent-soluble polyimide which is dissolved in an organic solvent from the viewpoint of coating properties. A soluble property of the organic-solvent-soluble polyimide which is dissolved in an organic solvent means that the polyimide is dissolved in at least one solvent selected from the following in an amount of 20 wt % or more at 23° C.: Ketone-based solvents such as acetone, methyl ethyl ketone, methyl isobutyl ketone, cyclopentanone and cyclohexanone; ether-based solvents such as 1,4-dioxane, tetrahydrofuran and diglyme; glycol ether-based solvents such as methyl cellosolve, ethyl cellosolve, propylene glycol monomethyl ether, propylene glycol monoethyl ether, propylene glycol monobutyl ether and diethylene glycol methyl ethyl ether; and other solvents such as benzyl alcohol, N-methylpyrrolidone, γ-butyrolactone, ethyl acetate and N,N-dimethylformamide.

In the general formulae (2) and (3), $R^3$ represents a structural component of an acid dianhydride, and particularly, $R^3$ is preferably a tetra- to 14-valent organic group having 5 to 40 carbon atoms. $R^4$ represents a structural component of a diamine, and particularly, $R^4$ is preferably a di- to 12-valent organic group having 5 to 40 carbon atoms. Both of $R^3$ and $R^4$ preferably contain at least one of the specific groups.

$R^5$ is a substituent of the acid dianhydride, and preferably a group selected from the group consisting of a phenolic hydroxyl group, a sulfonic acid group and a thiol group. $R^6$ is a substituent of the diamine, and preferably a group selected from the group consisting of a phenolic hydroxyl group, a sulfonic acid group and a thiol group.

Acid dianhydrides to be used will be described. Specific examples of the acid dianhydride having at least one of the specific groups include 2,2-bis(3,4-dicarboxyphenyl)propane dianhydride, 2,2-bis(2,3-dicarboxyphenyl)propane dianhydride, bis(3,4-dicarboxyphenyl)sulfone dianhydride, bis(3,4-dicarboxyphenyl)ether dianhydride, 2,2-bis(3,4-dicarboxyphenyl)hexafluoropropane dianhydride, and derivatives thereof each having an alkyl substituent or a halogen substituent on its aromatic ring.

Specific examples of the acid dianhydride having at least one of the specific groups and at least one group selected from the group consisting of a phenolic hydroxyl group, a sulfonic acid group, and a thiol group include aromatic acid dianhydrides having a structure described below.

[Chemical Formula 3]

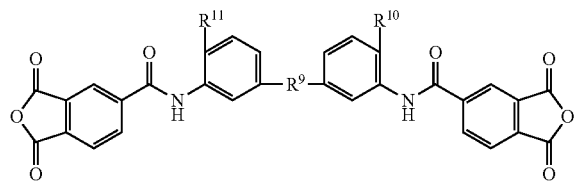

In the above formula, $R^9$ represents $C(CF_3)_2$, $C(CH_3)_2$, $SO_2$, S or O. $R^{10}$ and $R^{11}$ are each a hydrogen atom, a hydroxyl group, a thiol group or a sulfonic acid group. However, $R^{10}$ and $R^{11}$ are not a hydrogen atom at the same time.

Specific examples of the acid dianhydride not having the specific group and having at least one group seledted from the group consisting of a phenolic hydroxyl group, a sulfonic acid group and a thiol group include aromatic acid dianhydrides having a structure described below.

[Chemical Formula 4]

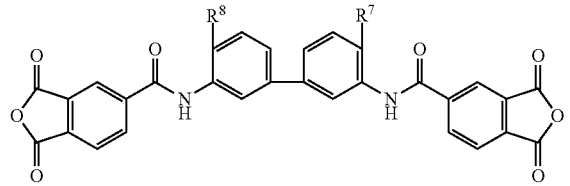

$R^7$ and $R^8$ are each a hydrogen atom, a hydroxyl group, a thiol group or a sulfonic acid group. However, $R^7$ and $R^8$ are not a hydrogen atom at the same time.

Specific examples of the acid dianhydride not having the specific group and not having a phenolic hydroxyl group, a sulfonic acid group or a thiol group include aromatic tetracarboxylic dianhydrides such as pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, 1,2,5,6-naphthalenetetracarboxylic dianhydride, 2,3,6,7-naphthalenetetracarboxylic dianhydride, 2,3,5,6-pyridinetetracarboxylic dianhydride and 3,4,9,10-perylenetetracarboxylic dianhydride, and derivatives thereof each having an alkyl substituent or a halogen substituent on its aromatic ring.

In the present invention, these acid dianhydrides are used singly or in combination of two or more thereof.

Diamines that can be used will be described. Specific examples of the diamine having at least one of the specific groups described above include 3,4'-diaminodiphenylsulfide, 4,4'-diaminodiphenylsulfide, 3,4'-diaminodiphenyl ether, 4,4'-diaminodiphenyl ether, 3,4'-diaminodiphenylsulfone, 4,4'-diaminodiphenylsulfone, bis(4-aminophenoxyphenyl)sulfone, bis(3-aminophenoxyphenyl)sulfone, bis(4-aminophenoxy)biphenyl, bis[4-(4-aminophenoxy)phenyl] ether, 1,4-bis(4-aminophenoxy)benzene, 1,3-bis(4-aminophenoxy)benzene, 2,2-bis[4-(4-aminophenoxy)phenyl]hexafluoropropane, 2,2-bis[4-(4-aminophenoxy)phenyl]propane, and derivatives thereof each having an alkyl substituent or a halogen substituent on its aromatic ring.

Specific examples of the diamine having at least one of the specific groups and at least one group selected from the group consisting of a phenolic hydroxyl group, a sulfonic acid group, and a thiol group include 2,2-bis(3-amino-4-hydroxyphenyl)hexafluoropropane, 2,2-bis(3-hydroxy-4-aminophenyl)hexafluoropropane, 2,2-bis(3-amino-4-hydroxyphenyl)propane, 2,2-bis(3-hydroxy-4-aminophenyl)propane, 3,3'-diamino-4,4'-dihydroxydiphenyl ether, 3,3'-diamino-4,4'-dihydroxydiphenylsulfone, 3,3'-diamino-4,4'-dihydroxydiphenylsulfide, derivatives thereof each having an alkyl substituent or a halogen substituent on its aromatic ring, and diamines having one of structures described below.

[Chemical Formula 5]

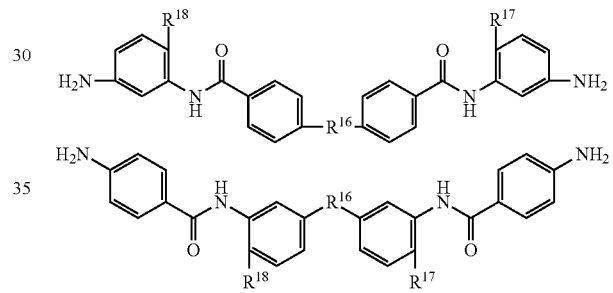

In the above formula, $R^{16}$ represents $C(CF_3)_2$, $C(CH_3)_2$, $SO_2$, S or O. $R^{17}$ and $R^{18}$ are each a hydrogen atom, a hydroxyl group, a thiol group, or a sulfonic acid group. However, $R^{17}$ and $R^{18}$ are not a hydrogen atom at the same time.

Specific examples of the diamine not having the specific group and having at least one group selected from the group consisting of a phenolic hydroxyl group, a sulfonic acid group and a thiol group include 3,3'-diamino-4,4'-dihydroxybiphenyl, 2,4-diaminophenol, 2,5-diaminophenol, 1,4-diamino-2,5-dihydroxybenzene, diaminodihydroxypyrimidine, diaminodihydroxypyridine, hydroxydiaminopyrimidine, 9,9-bis(3-amino-4-hydroxyphenyl)fluorene, derivatives thereof each having an alkyl substituent or a halogen substituent on its aromatic ring, and diamines having one of structures described below.

[Chemical Formula 6]

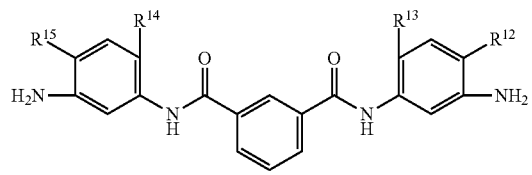

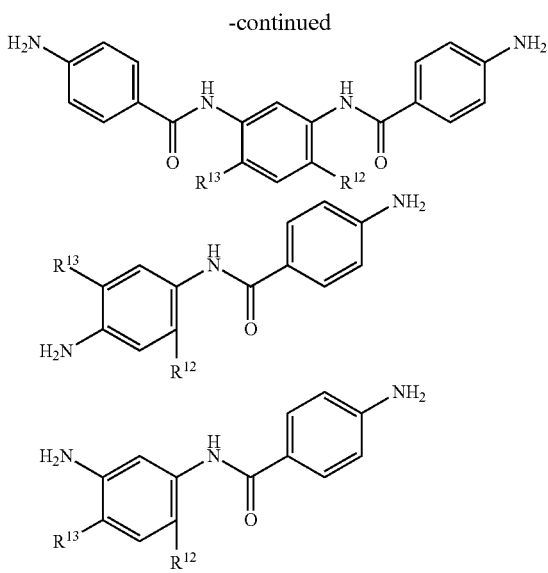

In the above formula, $R^{12}$ to $R^{15}$ are each a hydrogen atom, a hydroxyl group, a thiol group, or a sulfonic acid group. However, $R^{12}$ and $R^{13}$ are not a hydrogen atom at the same time.

Specific examples of the diamine not having the specific group and not having a phenolic hydroxyl group, a sulfonic acid group or a thiol group include 3,4'-diaminodiphenylmethane, 4,4'-diaminodiphenylmethane, benzidine, m-phenylenediamine, p-phenylenediamine, 1,5-naphthalenediamine, 2,6-naphthalenediamine, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, derivatives thereof each having an alkyl substituent or a halogen substituent on its aromatic ring; and terephthalic acid hydrazide, isophthalic acid hydrazide, phthalic acid hydrazide, 2,6-naphthalenedicarboxylic acid dihydrazide, 4,4'-bisphenyl dicarbonohydrazine, 4,4'-cyclohexane dicarbonohydrazine, and hydrazide derivatives thereof each having an alkyl substituent or a halogen substituent on its aromatic ring. The diamines used in the present invention are used singly or in combination of two or more thereof.

Further, the structure represented by the general formula (1) is included as $R^4$ in the general formulae (2) and (3), and is therefore a constituent of a diamine. Examples of the diamine containing the structure represented by the general formula (1) include bis(3-aminopropyl)tetramethyldisiloxane, bis(p-amino-phenyl)octamethylpentasiloxane and the like.

The rate of the reaction between the polyimide and the epoxy compound during heat treatment can be adjusted by selecting $R^5$ and $R^6$ in the general formulae (2) and (3), and thereby, the cross-linking density of the adhesive composition can be adjusted. This makes it possible to impart necessary heat resistance and chemical resistance to the adhesive composition. α and β each represent an integer of 0 to 10 and α+β is an integer of 0 to 10. However, 20 to 90% of the structural units whose repeating number is m show α+β=1 to 10. Further, 20 to 90% of the total of $R^5$s and $R^6$s are preferably phenolic hydroxyl groups, sulfonic acid groups, or thiol groups. By setting the ratio of these groups to the total of $R^5$s and $R^6$s to 20% or more, it is possible to improve the chemical resistance and heat resistance, and by setting the ratio to 90% or less, it is possible to keep the cross-linking density within an appropriate range to maintain the elongation and toughness of the film.

X, a structural component of the general formulae (2) and (3), is a component derived from a primary monoamine, a terminal blocking agent. These monoamines may be used singly or in combination with two or more of other terminal blocking agents. Specific examples of the primary monoamines include 5-aminoquinoline, 4-aminoquinoline, 3-aminonaphthalene, 2-aminonaphthalene, 1-aminonaphthalene, aniline and the like. Of these, aniline is preferably used.

A primary monoamine, not having another substituent which reacts with the epoxy compound, is preferably used. This makes it possible to obtain a polyimide not having a substituent which reacts with the epoxy compound, at the end of the polyimide having high molecular mobility. The use of such a polyimide makes it possible to suppress the progress of the reaction between the polyimide and the epoxy compound at room temperature to further enhance the storage life of the adhesive composition.

The ratio of the X component in the general formulae (2) and (3) to be introduced is preferably 0.1 to 60 mol %, and particularly preferably 5 to 50 mol % with respect to the total amount of diamine components on the primary monoamine component equivalent basis, the primary monoamine component as a terminal blocking agent being an X's original component.

In the general formulae (2) and (3), m represents the repeating number of the polymer and a range of 8 or more and 200 or less. m is preferably 10 to 150. A weight average molecular weight of the polyimide is preferably 4000 to 80000, and particularly preferably 8000 to 60000 on the polystyrene equivalent basis by gel filtration chromatography. By setting m to 8 or more, it is possible to increase the viscosity to enable a thick coating, and by setting m to 200 or less, it is possible to improve the solubility of the polyimide in a solvent. Here, the weight average molecular weight of the polyimide (A) can be determined by the following method. A polyimide solution having a solid concentration of 0.1% by weight prepared by dissolving the polyimide in N-methylpyrrolidone (NMP) is used, and a weight average molecular weight on the polystyrene equivalent basis is calculated using a GPC apparatus Waters 2690 (manufactured by Waters Corporation). GPC measurement is performed by using NMP containing 0.05 mol/L of LiCl and 0.05 mol/L of phosphoric acid dissolved therein as a mobile phase at a developing speed of 0.4 mL/min.

A GPC measurement system used includes, for example, the following.
Detector: Waters 996
System controller: Waters 2690
Column oven: Waters HTR-B
Thermo controller: Waters TCM
Columns: TOSOH (TSK-GEL Guard Column)
Columns: TOSOH TSK-GEL α-4000
Columns: TOSOH TSK-GEL α-2500

The polyimide (A) to be used in the present invention may be only a polyimide composed of structures represented by the general formulae (2) and (3), may be a copolymer having another structure as a copolymerization component in structures represented by the general formulae (2) and (3), or may be a mixture thereof. Furthermore, in any one of these polyimides, a polyimide represented by another structure may be mixed. In this case, the polyimide preferably contains structures represented by the general formulae (2) and (3) in an amount of 50 mol % or more. The type and amount of structure used for copolymerization or mixing are preferably selected without impairing the heat resistance of a heat resistant resin coating obtained by heating treatment.

The structure of the general formula (1) and the terminal blocking agent used in the present invention introduced into the polymer can be easily detected and quantitatively determined by the following method. For example, the polymer into which the structure of the general formula (1) and the terminal blocking agent are introduced is dissolved in an acidic solution or a basic solution and decomposed into polymer constituents, diamine components and acid anhydride components, and these components are subjected to measurement using gas chromatography (GC) or NMR, and thereby, the structure of the general formula (1) and the terminal blocking agent used can be easily detected and quantitatively determined. Alternatively, the structure of the general formula (1) and the terminal blocking agent used can also be easily detected and quantitatively determined by directly subjecting the polyimide into which the terminal blocking agent is introduced to measurement using pyrolysis gas chromatography (PGC), or using infrared spectrum and 13C-NMR spectrum.

In regard to the content of the polyimide (A), a ratio of the polyimide (A) in the nonvolatile organic component is 30 wt % or less from the viewpoint of coating properties to a substrate with a bump and filling performance into a space between bumps. When the ratio of the polyimide (A) in the nonvolatile organic component is higher than 30 wt %, it becomes difficult to control viscosity of the resin coating agent. The resin coating agent referred to herein refers to a coating solution whose viscosity is adjusted with an organic solvent for forming a coating on a wafer, a substrate, a support film or the like by an application method such as a spin coater. Further, the ratio of the polyimide (A) in the nonvolatile organic component is 3.0 wt % or more from the viewpoint of adhesive strength. Further, the ratio of the polyimide (A) in the nonvolatile organic component is more preferably 5.0 wt % or more and 30 wt % or less for reacting with an epoxy compound to form a highly dense network structure.

The adhesive composition of the present invention further contains a polyfunctional epoxy compound (B). The polyfunctional epoxy compound referred to herein refers to a compound containing two or more glycidyl groups or epoxy cyclohexyl groups in a molecule. When the polyimide (A) has a phenolic hydroxyl group, a sulfonic acid group, or a thiol group on its side chain, the polyfunctional epoxy compound (B) reacts with these groups to form a cured product having a higher-density network structure, and therefore the resulting cured adhesive composition exerts higher resistance to various chemicals. Further, since the epoxy compound is generally cured by a ring-opening reaction accompanied by no shrinkage, it becomes possible to reduce the shrinkage of the adhesive composition during curing. As the polyfunctional epoxy compound (B), an epoxy compound having an epoxy equivalent of 100 or more is preferably used. By setting the epoxy equivalent to 100 or more, the strength of the cured adhesive composition can be increased.

The polyfunctional epoxy compound (B) is not particularly limited as long as it is difunctional or more, and for example, a bisphenol A epoxy resin, a bisphenol F epoxy resin, a bisphenol S epoxy resin, a phenol novolac epoxy resin, a cresol novolac epoxy resin, a biphenyl epoxy resin, a hydroquinone epoxy resin, a diphenylsulfide skeleton-containing epoxy resin, a phenolaralkyl polyfunctional epoxy resin, a naphthalene skeleton-containing polyfunctional epoxy resin, a dicyclopentadiene skeleton-containing polyfunctional epoxy resin, a triphenylmethane skeleton-containing polyfunctional epoxy resin, an aminophenol epoxy resin, a diaminodiphenylmethane epoxy resin, and other various polyfunctional epoxy resins can be used.

Examples thereof include jER 828, jER 152, jER 1001, jER 1002, jER 1004AF, jER 1007, jER 1009, jER 1010, jER 1256, YX4000H, jER 4004P, jER 5050, jER 154, jER 157S70, jER 180S70, YX4000H and YL 980 (trade names, manufactured by Mitsubishi Chemical Corporation), TEPIC S, TEPIC G and TEPIC P (trade names, manufactured by NISSAN CHEMICAL INDUSTRIES, LTD.), EPOTOTE YH-434L (trade name, manufactured by Nippon Steel Chemical Co., Ltd.), EPPN 502H, NC3000 and NC3000H (trade names, manufactured by Nippon Kayaku Co., Ltd.), and EPICLON N695, EPICLON HP-7200 and EPICLON HP-4032 (trade names, manufactured by DIC CORPORATION), but the polyfunctional epoxy resin is not limited to these. These epoxy compounds may be used in combination of two or more thereof.

Among these, the bisphenol A epoxy resin is preferably used from the viewpoint of low moisture absorptivity, high heat resistance and toughness. The bisphenol A epoxy resin obtained by the reaction of bisphenol A with epichlorohydrin includes jER 828 and YL 980 having a bisphenol A skeleton, and jER 1010, jER 1256 and the like having a plurality of bisphenol A skeletons (trade names, manufactured by Mitsubishi Chemical Corporation).

From the viewpoint of a film-forming property during application of the adhesive composition, the epoxy equivalent weight (g/eq, sometimes omitted) in the polyfunctional epoxy compound (B) is preferably 1000 or more, and more preferably 2000 or more. Further, from the viewpoint of the solubility in an organic solvent such as propylene glycol monomethyl ether acetate or the like, the epoxy equivalent weight is preferably 7000 or less, more preferably 5000 or less, and moreover preferably 4000 or less. Examples of such a bisphenol A epoxy resin having an epoxy equivalent weight of 1000 or more and 7000 or less include jER1007, jER1009 and jER1010 (trade name, manufactured by Mitsubishi Chemical Corporation). Further, a ratio of the epoxy resin having an epoxy equivalent of 1000 or more and 7000 or less in the nonvolatile organic component is preferably 20 wt % or more and 70 wt % or less, and more preferably 20 wt % or more and 60 wt % or less from the viewpoint of a film-forming property.

Further it is preferred to mix a liquid epoxy compound from the viewpoint of flowability of the adhesive composition and filling performance into a space between projections such as copper pillar bumps or solder bumps. The liquid epoxy compound is an epoxy compound exhibiting a viscosity of 150 Pa·s or less at 25° C. at 1 atmospheric pressure. Specific examples thereof include EPOTOTE PG-207GS (manufactured by Nippon Steel Chemical Co., Ltd.) YL 980, jER 828, jER 806, jER 807 and YL 983U (trade name, manufactured by Mitsubishi Chemical Corporation).

Further, a ratio of the liquid epoxy compound in the nonvolatile organic component is preferably 5 wt % or more and 60 wt % or less, and more preferably 10 wt % or more and 50 wt % or less from the viewpoint of flowability of the adhesive composition and filling performance into a space between projections such as copper pillar bumps or solder bumps.

The adhesive composition of the present invention contains an epoxy curing agent (C). As the epoxy curing agent, an imidazole-based curing agent is preferred from the viewpoint of reactivity and storage stability since it is preferred that in a state of a resin coating agent including an organic solvent, viscosity of the coating agent does not largely increase. Examples of the imidazole-based curing agent include imidazole, 2-methylimidazole, 2-undecylimidazole, 1,2-dimethylimidazole, 2-ethyl-4-methylimidazole, 2-phenylimidazole, 2-phenyl-4-methylimidazole, and 2E4MZ, 2PZ, C11Z and 2P4MZ (trade name, manufactured by SHIKOKU CHEMICALS CORPORATION), and the like.

From the viewpoint of reactivity, a curing rate time of the imidazole-based curing agent is preferably 20 days or less, more preferably 5 days or less, and moreover preferably 2 days or less. Further, from the viewpoint of storage stability, the curing rate time of the imidazole-based curing agent is preferably 0.2 day or more, and more preferably 0.5 day or more. Specific examples of the imidazole-based curing agent whose curing rate time is 0.5 day or more and 2 days or less include 2PZ, 2PZ-OK (trade name, manufactured by SHIKOKU CHEMICALS CORPORATION), and the like. The curing rate time referred to herein refers to the number of days in which viscosity of a sample increases to two times as high as initial viscosity when 100 ml of the sample prepared by adding 5 parts by weight of the imidazole-based curing agent to 100 parts by weight of a bisphenol A liquid epoxy resin, was prepared, and stored at 25° C. in a sealed state.

A ratio of the epoxy curing agent (C) in the nonvolatile organic component is 0.5 wt % or more and 10 wt % or less. By setting the content of the epoxy curing agent to 10 wt % or less, the resin coating agent composed of the adhesive composition can be stored at room temperature for an extended period of time, and the adhesive composition can be adequately cured. Further, when the ratio of the epoxy curing agent (C) in the nonvolatile organic component is more than 10 wt %, curing of the adhesive composition proceeds, but a time during which the adhesive composition can be used at room temperature is shortened. The ratio of the epoxy curing agent (C) in the nonvolatile organic component is preferably 5 wt % or less, and more preferably 3 wt % or less. Further, the ratio of the epoxy curing agent (C) in the nonvolatile organic component is 0.5 wt % or more, and preferably 1.0 wt % or more. By setting the ratio of the epoxy curing agent (C) to 0.5 wt % or more, it is possible to prepare a semiconductor device having higher connection reliability.

The adhesive composition of the present invention contains inorganic particles (D). The inorganic particle can adjust a melt viscosity of the adhesive composition to such an extent that the adhesive composition is not foamed during thermally curing it. As the material of the inorganic particles (D), silica, alumina, titania, silicon nitride, boron nitride, aluminum nitride, iron oxide, glass, and other metal oxides and metal nitrides, metal carbonates, and metal sulfates such as barium sulfate can be used singly or in combination of two or more thereof. Among these materials, silica can be preferably used in terms of low thermal expansibility, thermal dissipation performance, low moisture absorptivity, and dispersion stability in the adhesive composition.

The inorganic particles (D) may have either a spherical form or a nonspherical form such as a crushed form and a flake form; however, the inorganic particles having a spherical form can be preferably used because of easy uniform dispersibility in the adhesive composition. Further, the average particle diameter of the spherical inorganic particles is preferably 3 μm or less, more preferably 1.0 μm or less, and moreover preferably 700 nm or less from the viewpoint of filling performance into a space between projections such as copper pillar bumps or solder bumps. Further, the average particle diameter is preferably 10 nm or more, and when the average particle size is 10 nm or more, the inorganic particles have excellent dispersibility and can be filled into the adhesive composition in a high concentration. Further, from the viewpoint of coating properties of the prepared resin coating agent, the average particle diameter is preferably 100 nm or more, and more preferably 300 nm or more.

When transparency is required of the adhesive composition, the particle diameter of the inorganic particle is preferably 100 nm or less, and more preferably 60 nm or less. For example, the adhesive composition needs to have transparency for the case where, after a film of the adhesive composition is formed on a substrate, it is necessary to visually identify marks on the surface of the substrate through the adhesive composition for the purpose of alignment and the like.

Further, when the resin coating agent is prepared, the inorganic particles (D) may be added in a slurry state in which particles are dispersed in an organic solvent, or may be added in a powder form without a solvent. Further, both of inorganic particles in a slurry state and powdery inorganic particles may be added. The inorganic particles in a slurry state are preferably used from the viewpoint of dispersibility of inorganic particles.

In addition, the average particle diameter of the inorganic particles refers to a particle diameter in the case where the inorganic particles are present singly and refers to a particle diameter whose frequency is the highest. When the inorganic particles have a spherical form, the particle diameter refers to its diameter, and when the inorganic particles have an elliptical shape or a flattened shape, the particle diameter refers to the maximum length in its shape. Moreover, when the shape is a rod shape or a fibrous form, the particle diameter represents the maximum length in the longitudinal direction. As a method of measuring an average particle diameter of the inorganic particles in the adhesive composition, the average particle diameter can be measured by a method in which the particles are directly observed with a SEM (scanning electron microscope) and an average of the particle diameters of 100 particles is calculated.

Further, the inorganic particles are preferably surface-treated from the viewpoint of dispersibility of inorganic particles (D) and adhesive properties between the inorganic particles and a surrounding resin. As a surface treating agent, a common silane coupling agent can be employed; however, a silane coupling agent containing an epoxy group, and a silane coupling agent containing an amino group are preferred from the viewpoint of dispersibility and adhesive properties.

The content of the inorganic particles (D) is preferably 50 wt % or more and 80 wt % or less, more preferably 60 wt % or more and 75 wt % or less, and moreover preferably 60 wt % or more and 70 wt % or less with respect to the total amount of a nonvolatile component. When the content of the inorganic particles (D) is 50 wt % or more, it is possible to prepare a semiconductor device having higher connection reliability in using the adhesive composition. When the content of the inorganic particles (D) is 80 wt % or less, dispersibility of the inorganic particles becomes higher. The nonvolatile component referred to herein refers to a component including the nonvolatile organic component and a nonvolatile inorganic component.

The adhesive composition of the present invention may contain a thermoplastic resin to an extent not impairing the effect of the present invention for the purpose of reducing stress of a film after curing. Examples of the thermoplastic resin include a phenoxy resin, a polyester, a polyurethane, a polyamide, a polypropylene, an acrylonitrile-butadiene copolymer (NBR), a styrene-butadiene copolymer (SBR), an acrylonitrile-butadiene-methacrylic acid copolymer, an acrylonitrile-butadiene-acrylic acid copolymer and the like, but the material is not limited to these.

The adhesive composition of the present invention and the resin coating agent composed of the adhesive composition may contain a surfactant to an extent not impairing the effect of the present invention for the purpose of improving compatibility with the substrate. Such a surfactant is not particularly limited, and examples thereof include a fluorine-based surfactant, a silicone-based surfactant, a nonionic surfactant and the like. Among these surfactants, the fluorine-based surfactant is preferred which has a high effect of improving compatibility with the substrate.

Specific examples of the fluorine-based surfactants (hereinafter, trade name) include Megafac F171, F173, R-30 (manufactured by DIC Corporation (the former Dainippon Ink and Chemicals, Inc.)), Fluorad FC-430, FC-431 (manufactured by Sumitomo 3M Ltd.), Asahi Guard AG710, Surflon S-382, SC-101, SC-102, SC-103, SC-104, SC-105, and SC-106 (manufactured by Asahi Glass Co., Ltd.), but the surfactant is not limited to these surfactants. Further, specific examples of the silicone-based surfactants (hereinafter, trade name) include BYK-378, BYK-337, BYK-306, BYK-333, BYK-375, BYK-370, BYK-377, BYK-323 and BYK-325 (manufactured by BYK-Chemie Japan), but the surfactant is not limited to these surfactants. The surfactant may also be used in combination of a plurality of types.

The adhesive composition of the present invention and the resin coating agent composed of the adhesive composition may contain an adhesion promoter to an extent not impairing the effect of the present invention for the purpose of improving adhesion to the substrate. In doing so, plural types of the adhesion promoters may be used in combination.

Examples of such adhesion promoters include chlorosilanes such as trimethylchlorosilane, vinyltrichlorosilane, dimethylvinylchlorosilane, methyldiphenylchlorosilane and chloromethyldimethylchlorosilane; alkoxysilanes such as γ-chloropropyltrimethoxysilane, γ-aminopropyltriethoxysilane, γ-methacryloxypropyltrimethoxysilane, γ-glycidoxypropyltrimethoxysilane, γ-(N-piperidinyl)propyltrimethoxysilane, trimethylmethoxysilane, dimethyldimethoxysilane, dimethyldiethoxysilane, dimethylvinylethoxysilane, diphenyldimethoxysilane and phenyltriethoxysilane; silazanes such as hexamethyldisilazane and octamethylcyclotetrasilazane; silanes such as (N,N-dimethyl)trimethylsilylamine and trimethylsilylimidazole; heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole and mercaptopyrimidine; and ureas such as N,N'-bis(trimethylsilyl)urea, 1,1-dimethylurea and 1,3-dimethylurea, and thiourea compounds.

The adhesive composition of the present invention and the resin coating agent composed of the adhesive composition may contain a flux agent. As the flux agent, organic acid compounds having a carboxylic acid group or the like can be used.

In order to prepare a resin coating agent from the adhesive composition of the present invention, a polyimide (A), a polyfunctional epoxy compound (B), an epoxy curing agent (C), and inorganic particles (D) may be mixed and stirred to dissolve the polyimide (A), the polyfunctional epoxy compound (B) and the epoxy curing agent (C) in an organic solvent, and to disperse the inorganic particles (D). The organic solvent to be used in this time may be one in which the polyimide (A), the polyfunctional epoxy compound (B) and the epoxy curing agent (C) are dissolved.

Specific examples of the organic solvent include ethers such as ethylene glycol monomethyl ether, ethylene glycol monoethyl ether, propylene glycol monomethyl ether, propylene glycol monoethyl ether, ethylene glycol dimethyl ether, ethylene glycol diethyl ether, ethylene glycol dibutyl ether, diethylene glycol monoethyl ether; acetates such as ethylene glycol monoethyl ether acetate, propylene glycol monomethyl ether acetate, propyl acetate, butylacetate, isobutylacetate, 3-methoxybutyl acetate, 3-methyl-3-methoxybutyl acetate, methyl lactate, ethyl lactate and butyl lactate; ketones such as acetone, methyl ethyl ketone, acetylacetone, methyl propyl ketone, methyl butyl ketone, methyl isobutyl ketone, cyclopentanone and 2-heptanone; alcohols such as butyl alcohol, isobutyl alcohol, pentanol, 4-methyl-2-pentanol, 3-methyl-2-butanol, 3-methyl-3-methoxybutanol and diacetone alcohol; aromatic hydrocarbons such as toluene and xylene; N-methyl-2-pyrrolidone, N-cyclohexyl-2-pyrrolidone, N,N-dimethylformamide, N,N-dimethylacetamide, dimethylsulfoxide and γ-butyrolactone. Among these solvents, solvents in which the component (A) is dissolved and which has a boiling point of 100° C. to 180° C. at atmospheric pressure are particularly preferred. When the boiling point is in this range, it does not happen that when applying the resin coating agent, the solvent excessively volatilizes to fail in application of the resin coating agent, and since a drying/heat treatment temperature of the resin coating agent does not need to be elevated, a material of the substrate or support film is not subjected to constraints. Further, by using the solvent in which the component (A) is dissolved, a highly uniform coating can be formed on the substrate or the support film. Herein, the boiling point referred to in the present invention is a boiling point at 1 atmospheric pressure, that is, a pressure of $1.013 \times 10^5$ N/m$^2$. The boiling point can be measured using a publicly known technology, and it is not particularly limited, and can be measured, for example, by using a boiling point meter of Swietoslawski.

Specific examples of particularly preferred organic solvent having such a boiling point include cyclopentanone, ethylene glycol monomethyl ether, ethylene glycol monoethyl ether, propylene glycol monomethyl ether, propylene glycol monomethyl ether acetate, methyl lactate, ethyl lactate, diacetone alcohol, 3-methyl-3-methoxybutanol and the like.

Further, the resin coating agent obtained by mixing, dissolving and dispersing the materials as described above may be filtered using a filter paper or a filter. A method of filtering is not particularly limited; however, in order to pass the inorganic particles (D) dispersed, a filtration method is preferred in which the resin coating agent is filtered by pressurized filtration using a filter with a retained particle diameter of 10 μm or more.

The nonvolatile organic component of the present invention refers to an organic chemical material in the components contained in the adhesive composition or the resin coating agent, the organic chemical material not resulting in weight loss of 5% or more when performing thermogravimetric measurement at 200° C. for 1 hour. Further, the adhesive composition of the present invention is characterized in that T/M is 400 or more and 8000 or less when the total number of grams of the nonvolatile organic component is denoted by T (unit: g), and the number of moles of epoxy groups in the nonvolatile organic component is denoted by M (unit: mol).

When the T/M is 400 or more, the adhesive composition becomes a material which hardly breaks even in a cracked state. When the T/M is less than 400, strength in a cracked state is decreased. Further, the the T/M is preferably 450 or more, and more preferably 500 or more from the viewpoint of strength. Further, from the viewpoint of adhesiveness, the T/M is 8000 or less. Further, from the viewpoint of reliability, the T/M is preferably 4000 or less, more preferably 2000 or less, and moreover preferably 1000 or less.

Next, a method for producing an adhesive film using the resin coating agent composed of the adhesive composition of the present invention will be described. An adhesive film of the present invention is characterized by having a layer composed of the adhesive composition of the present invention and a support film. The adhesive film of the present invention is obtained by applying the above-mentioned resin coating agent onto a support film, and then drying it as required.

The adhesive film of the present invention has the layer composed of the adhesive composition of the present invention and the support film. The support film used in this case is not particularly limited, and various films usually commercially available, such as polyethylene terephthalate (PET) films, polyphenylene sulfide films and polyimide films, can be used. The support film includes, for example, Cerapeel HP2 (U) (manufactured by TORAY ADVANCED FILM Co., Ltd.), polyethylene terephthalate film.

Bonding plane between the layer composed of the adhesive composition of the present invention and the support film may be surface treated with silicone, a silane coupling agent, an aluminum chelate agent or the like for the purpose of improving adhesion and releasability. Further, a thickness of the support film is not particularly limited; however, it is preferably in the range of 10 to 75 μm from the viewpoint of workability.

The adhesive film of the present invention may have a protective film on the film for protecting a surface of the layer composed of the adhesive composition of the adhesive film. Thereby, the surface of the layer composed of the adhesive composition of the adhesive film can be protected from contaminants such as debris and dusts in the atmosphere.

Examples of the protective film include polyethylene films, polypropylene (PP) films, polyester films, and the like. The protective film includes, for example, SR3 (manufactured by OHTSUKI INDUSTRIAL Co., Ltd.), polyethylene terephthalate film. The protective film preferably has small adhesive force to the layer composed of the adhesive composition of the adhesive film.

Examples of a method of applying the resin coating agent composed of the adhesive composition of the present invention onto a support film include methods such as spray coating, roll coating, screen printing, a blade coater, a die coater, a calender coater, a meniscus coater, a bar coater, a roll coater, a comma roll coater, a gravure coater, a screen coater and a slit die coater. Further, an applied film thickness varies depending on the coating technique, the solid content of the resin composition, the viscosity and the like; however it is preferred that the dried film thickness is usually 0.5 μm or more and 100 μm or less.

For drying, an oven, a hot plate, infrared rays or the like may be used. The drying temperature and the drying time need only to be in a range where the organic solvent can be volatilized and it is preferred to appropriately set such a range in which the layer composed of the adhesive composition of the adhesive film is in a state of being uncured or semi-cured. Specifically, drying is preferably carried out in the range of 40 to 120° C. for 1 minute to several tens of minutes. Further, heat treatment may be carried out at various temperatures increasing in stages, for example, at 50° C., at 60° C., and then at 70° C. for 1 minute, respectively.

Next, properties of the adhesive composition of the present invention after being cured will be described. An elastic modulus at −40° C. of the cured adhesive composition is preferably 10 GPa or more and 15 GPa or less, more preferably 11 GPa or more and 14 GPa or less, and moreover preferably 11 GPa or more and 13 GPa or less from the viewpoint of reliability. The elastic modulus at −40° C. referred to herein refers to an elastic modulus at −40° C. at the time when a dynamic viscoelasticity of a test piece having a size of 5 mm×50 mm×0.5 mm is measured under the conditions of a frequency of 1 Hz, a temperature raising rate of 5° C./rain and a measurement strain of 0.02%.

The maximum strength of a cured product of the adhesive composition of the present invention is preferably 28 N or more. When the maximum strength is 28 N or more, break of a semiconductor can be prevented even though cracks are produced within the semiconductor, and reliability of the semiconductor can be increased. By setting the T/M to 400 or more, the maximum strength of 28 N or more can be attained. The maximum strength referred to herein refers to strength at which a test piece breaks when a three-point bending test was performed from a part opposite to a groove of the test piece under the conditions of a temperature of 23° C., a test speed of 166.6 μm/sec and a fulcrum height of 200 μm using the test piece formed by using a rectangular parallelepiped having a size of 4 mm×20 mm×2 mm, forming a groove of 1.84 mm deep and 300 μm wide in a direction parallel to both sides of 2 mm wide at a position 10 mm away in a length direction from both sides of 2 mm wide in a face of 2 mm×20 mm of the rectangular parallelepiped, namely, a central position of the face of 2 mm×20 mm, and preparing cracks in the groove portion.

A substrate provided with the adhesive composition of the present invention is characterized by having the layer composed of the adhesive composition of the present invention and a substrate. With respect to a method of forming the adhesive composition of the present invention on a substrate, the resin coating agent may be applied by a method such as spin coating using a spinner, screen printing, a blade coater, a die coater, a calender coater, a meniscus coater, a bar coater, a roll coater, a comma roll coater, a gravure coater, a screen coater or a slit die coater, or an adhesive film prepared by coating the resin coating agent on a support film may be formed on a substrate by thermocompression bonding such as hot pressing, thermally laminating, vacuum thermally laminating or the like.

A semiconductor device of the present invention has the layer composed of the adhesive composition of the present invention. The adhesive composition or the resin coating agent, and the adhesive film of the present invention can be suitably used as semiconductor adhesives and semiconductor coating materials for bonding, fixing or sealing a semiconductor element, a circuit board or metal wiring materials or for reinforcing a wafer. Further, the semiconductor device referred to herein refers to overall devices capable of functioning by use of characteristics of a semiconductor element, and includes all of electrooptic devices, semiconductor circuits and electronic devices.

A method for producing a semiconductor device using the adhesive composition of the present invention will be described. The method for producing a semiconductor device of the present invention is a method for producing a semiconductor device in which the adhesive composition of the present invention is interposed between a first circuit member and a second circuit member, and the first circuit member is electrically connected to the second circuit member by heating/applying pressure to the adhesive composition.

Specifically, first, the first circuit member having a first electrode and the second circuit member having a second electrode are arranged so as to be opposed to each other. Then, the adhesive composition of the present invention is interposed between the first circuit member and the second circuit member arranged so as to be opposed to each other. Here, a method of interposing the adhesive composition between these circuit members may be a method in which the adhesive composition is directly applied to the surface of a circuit member and then a volatile component is removed, or a method in which the adhesive film of the present invention is bonded to the surface of a circuit member and then a support film is removed. The adhesive composition may be formed on the surface on an electrode side of only one of the two circuit members, or may be formed on the surfaces on an electrode side of both of the first circuit member and the second circuit member. Then, the first and second circuit members are bonded to each other by the application of heat and pressure to electrically connect the first electrode and the second electrode which are opposed to each other simultaneously. Electrical connection between electrodes may be made by mechanical pressing, or may be made by metal joint using a solder or the like. Further, a through electrode may be formed in one or both of the first circuit member and/or the second circuit member, and an electrode may be formed on one surface and/or both surfaces of the circuit member.

Next, an example of the case where the adhesive film of the present invention is used will be described. When using this method, a void between the semiconductor chip and the circuit board having a wiring pattern formed thereon can be sealed with a cured product of the adhesive composition.

At first, the adhesive film is cut out into a predetermined size, and bonded to a wiring pattern surface of the circuit board having a wiring pattern formed thereon, and the support film is removed. Alternatively, a semiconductor chip having an adhesive film bonded thereto, the adhesive film not including a support film may be prepared by bonding an adhesive film to a bump-formed surface of a semiconductor wafer before cutting out a semiconductor chip, removing the support film, and then individualizing the semiconductor wafer through dicing. Bonding of the adhesive film can be performed by using a bonding device such as a roll laminator or a vacuum laminator.

After the adhesive film is bonded to a circuit board or a semiconductor chip and the support film is removed from the adhesive film, the semiconductor chip is mounted on the circuit board by a bonding device. Bonding conditions are not particularly limited as long as good electrical connection can be achieved; however, bonding is preferably performed under conditions of application of heat and pressure at a temperature of 100° C. or higher and at a pressure of 1 mN/bump or more for 0.1 second or longer in order to cure the adhesive composition. Bonding is performed under conditions of a temperature of more preferably 120° C. or higher and 300° C. or lower and moreover preferably 150° C. or higher and 250° C. or lower, a pressure of more preferably 5 mN/bump or more and 50000 mN/bump or less and moreover preferably 10 mN/bump or more and 10000 mN/bump or less, and a time of more preferably 1 sec or more and 60 sec or less and moreover preferably 2 sec or more and 30 sec or less. Further, in the bonding, temporary press-bonding is performed by contacting bumps on the semiconductor chip with a pad electrode on the circuit board through the application of heat and pressure at a temperature of 50° C. or higher and a pressure of 1 mN/bump or more for 0.1 second or longer, and then the bonding is performed under the above conditions. After the bonding is performed, as required, the circuit board provided with the semiconductor chip may be heated at a temperature of 50° C. or higher and 200° C. or lower for 10 seconds or more and 24 hours or less.

The adhesive composition of the present invention can be suitably used as an adhesive composition for bonding or fixing circuit members constituting the semiconductor device to each other or sealing them. Further, the adhesive composition can be used for an insulating layer, a permanent resist, a solder resist and a sealing agent which constitute a circuit board such as a buildup multilayer board, or an etching resist which is used for producing a semiconductor device. Herein, the circuit member refers to members such as a semiconductor chip, chip parts, a circuit board and metal wiring materials which constitute a semiconductor device. Specific examples of the circuit members include semiconductor chip provided with bumps such as plated bumps or stud bumps; chip parts such as a resistor chip and a capacitor chip; and a semiconductor chip or a silicon interposer having TSV (through-silicon via) electrodes. Further, the semiconductor device referred to herein refers to overall devices capable of functioning by use of characteristics of a semiconductor element, and includes all of semiconductor circuits and electronic devices.

Further, the adhesive composition of the present invention can be used as an adhesive composition for preparing, in addition to this, a die attach film, a dicing die attach film, a lead frame fixing tape, a heat dissipation plate, a reinforcing plate, an adhesive of a shielding material, a solder resist and the like.

EXAMPLES

The present invention will be described below with reference to examples, but these examples are not intended to limit the present invention. Evaluations of the adhesive composition in Examples were performed by the methods described below.

<Measurement of Maximum Strength>

A jig SHR-250-CAP-05-3 (manufactured by Dage Precision Industries, Inc.) was fixed so that a distance of center is 16 mm, and a three-point bending test was performed from a part opposite to a groove of each of test pieces obtained in Examples and Comparative Examples using a die shear tester DAGE-SERIES-4000PXY (manufactured by Dage Precision Industries, Inc.). A die shear test was carried out under the conditions of a temperature of 23° C., a test speed of 166.6 µm/sec and a fulcrum height of 200 µm using DS100 control version.

<Measurement of Elastic Modulus>

A dynamic viscoelasticity of a test piece having a size of 5 mm×50 mm×0.5 mm was measured under the conditions of a frequency of 1 Hz, a temperature raising rate of 5° C./rain and a measurement strain of 0.02% using a dynamic viscoelastic analyzer DVA-200 (manufactured by ITK Co., Ltd.) and the elastic modulus (GPa) at −40° C. was measured.

Further, synthesis of the polyimide (A) used in Examples and Comparative Examples was performed by the following method.

Synthesis Example 1

Synthesis of Polyimide

Under a stream of dry nitrogen, 4.82 g (0.0165 mol) of 1,3-bis(3-aminophenoxy) benzene, 3.08 g (0.011 mol) of 3,3'-diamino-4,4'-dihydroxydiphenyl sulfone, 4.97 g (0.02 mol) of bisaminopropyltetramethyldisiloxane, and 0.47 g (0.005 mol) of aniline as an terminal blocking agent were dissolved in 130 g of NMP. To the resulting solution, 26.02 g (0.05 mol) of 2,2-bis{4-(3,4-dicarboxyphenoxy)phenyl}propane dianhydride was added together with 20 g of NMP and reacted at 25° C. for 1 hour, and then the solution was stirred at 50° C. for 4 hours. Thereafter, the solution was stirred at 180° C. for 5 hours. After completion of the stirring, the solution was introduced into 3 L of water and filtered to collect a precipitate, and the precipitate was washed with water three times and dried at 80° C. for 20 hours using a vacuum drier. The resulting polymer solid was subjected to infrared absorption spectrum measurement, and consequently absorption peaks of an imide structure attributed to polyimide were detected around 1780 $cm^{-1}$ and around 1377 $cm^{-1}$. In this manner, a polyimide which had a functional group capable of reacting with an epoxy group and included the structure represented by the general formula (1) in an amount of 11.6 wt % was obtained. When 6 g of tetrahydrofuran was added to 4 g of the polyimide and stirred at 23° C., the polyimide was dissolved in tetrahydrofuran.

Other components used in Examples and Comparative Examples are as described below.

(B) Polyfunctional Epoxy Compound:
EPOTOTE PG-207GS (manufactured by Nippon Steel Chemical Co., Ltd.), epoxy equivalent weight 314 g/eq, liquid epoxy compound
jER 1010 (manufactured by Mitsubishi Chemical Corporation), epoxy equivalent weight 3770 g/eq
YL 980 (manufactured by Mitsubishi Chemical Corporation), epoxy equivalent weight 185 g/eq, liquid epoxy compound
jER 1009 (manufactured by Mitsubishi Chemical Corporation), epoxy equivalent weight 2719 g/eq
N-865 (manufactured by DIC Corporation), epoxy equivalent weight 205 g/eq
NC-3000-H (manufactured by Nippon Kayaku Co., Ltd.), epoxy equivalent weight 287 g/eq (C) Epoxy Curing Agent
2PZ (manufactured by SHIKOKU CHEMICALS CORPORATION, imidazole-based curing agent)
NOVACURE HX-3941HP (manufactured by Asahi Kasei E-materials Corporation, aromatic polyamine-based curing agent)

(D) Inorganic Particle
SE2050-KNK (manufactured by Admatechs Co., Ltd.), silica treated with a phenylamino group-containing silane coupling agent, product dispersed in a methyl isobutyl ketone solvent, solid concentration 70.0 wt %, average particle diameter of silica 0.57 μm.
SE2050-ENA (manufactured by Admatechs Co., Ltd.), silica treated with a phenylamino group-containing silane coupling agent, product dispersed in a carbitol solvent, solid concentration 70.0% by weight, average particle diameter of silica 0.6 μm.

(E) Organic Solvent
Propylene glycol monomethyl ether acetate (hereinafter, sometimes referred to as "PGMEA") (manufactured by Tokyo Chemical Industry Co., Ltd)

Example 1

The polyimide (5.83 g) obtained in Synthetic Example 1, EPOTOTE PG-207GS (manufactured by Nippon Steel Chemical Co., Ltd., epoxy equivalent weight 314 g/eq) (9.32 g), jER 1010 (manufactured by Mitsubishi Chemical Corporation, epoxy equivalent weight 3770 g/eq) (17.48 g), 2PZ (manufactured by SHIKOKU CHEMICALS CORPORATION) (0.67 g), SE2050-KNK (manufactured by Admatechs Co., Ltd.) (111.0 g), and propylene glycol monomethyl ether acetate (5.70 g) were added to a 250 mL polyethylene container, and the resulting mixture was stirred at room temperature for 96 hours on a ball mill stand. Thereafter, using a filter with a retained particle diameter of 10 μm, the resulting mixed liquid was subjected to pressurized filtration to obtain a resin coating agent 1 (T/M =970 g/mol).

In addition, a calculation method of a value of the T/M is as follows, and the value of the T/M is also calculated by the same method in other Examples and Comparative Examples.

$T$ (total number of grams of the nonvolatile organic component)=5.83+9.32+17.48+0.67

$M$ (number of moles of epoxy groups in the nonvolatile organic component)=9.32/314+17.48/3770

$T/M$=(5.83+9.32+17.48+0.67)/(9.32/314+17.48/3770)=970

Example 2

The polyimide (51.45 g) obtained in Synthetic Example 1, YL 980 (manufactured by Mitsubishi Chemical Corporation, epoxy equivalent weight 185 g/eq) (65.17 g), jER 1009 (manufactured by Mitsubishi Chemical Corporation, epoxy equivalent weight 2719 g/eq) (51.45 g), 2PZ (manufactured by SHIKOKU CHEMICALS CORPORATION) (3.43 g), SE2050-KNK (manufactured by Admatechs Co., Ltd.) (455.0 g), and PGMEA (73.50 g) were added to a 2 l polyethylene container, and the resulting mixture was stirred at room temperature for 96 hours on a ball mill stand. Thereafter, using a filter with a retained particle diameter of 10 μm, the resulting mixed liquid was subjected to pressurized filtration to obtain a resin coating agent 2 (T/M=462 g/mol). Viscosity of the resin coating agent 2 was measured at 0.1 rpm using a viscometer RE105L (manufactured by Toki Sangyo Co., Ltd.), and consequently the viscosity was 2600 cP. Further, the viscosity of the resin coating agent 2 at 0.1 rpm was measured after storing the resin coating agent 2 for 24 hours in a thereto-hygrostat adjusted to a temperature of 25° C. and humidity of 50%, and consequently the viscosity was 2800 cP, and it was confirmed that the resin coating agent 2 is excellent in storage stability at room temperature.

Example 3

The polyimide (44.10 g) obtained in Synthetic Example 1, YL 980 (manufactured by Mitsubishi Chemical Corporation, epoxy equivalent weight 185 g/eq) (55.86 g), jER 1009 (manufactured by Mitsubishi Chemical Corporation, epoxy equivalent weight 2719 g/eq) (44.10 g), 2PZ (manufactured by SHIKOKU CHEMICALS CORPORATION) (2.94 g), SE2050-KNK (manufactured by Admatechs Co., Ltd.) (490.0 g), and PGMEA (63.00 g) were added to a 2 l polyethylene container, and the resulting mixture was stirred at room temperature for 96 hours on a ball mill stand. Thereafter, using a filter with a retained particle diameter of 10 μm, the resulting mixed liquid was subjected to pressurized filtration to obtain a resin coating agent 3 (T/M=462 g/mol).

Example 4

The polyimide (3.15 g) obtained in Synthetic Example 1, YL 980 (manufactured by Mitsubishi Chemical Corporation, epoxy equivalent weight 185 g/eq) (8.82 g), jER 1010 (manufactured by Mitsubishi Chemical Corporation, epoxy equivalent weight 3770 g/eq) (18.90 g), 2PZ (manufactured by SHIKOKU CHEMICALS CORPORATION) (0.63 g), SE2050-KNK (manufactured by Admatechs Co., Ltd.) (105.0 g), and PGMEA (13.50 g) were added to a 250 mL polyethylene container, and the resulting mixture was stirred at room temperature for 96 hours on a ball mill stand. Thereafter, using a filter with a retained particle diameter of 10 μm, the resulting mixed liquid was subjected to pressurized filtration to obtain a resin coating agent 4 (T/M=598 g/mol).

Example 5

The resin coating agent 1 prepared in Example 1 was applied onto a support film Cerapeel HP2 (U) (manufactured by TORAY ADVANCED FILM Co., Ltd.) having a thickness of 75 μm with use of a bar coater, and dried for 10 minutes in an oven heated to 100° C. To the resulting coating surface, SR3 (manufactured by OHTSUKI INDUSTRIAL CO., LTD.) having a thickness of 25 μm was bonded as a protective film to produce a laminate of the protective film and the adhesive film 1. A thickness of a layer obtained from the resin coating agent 1 in the adhesive film 1 was 30 μm.

Example 6

The resin coating agent 2 prepared in Example 2 was applied onto a support film Cerapeel HP2 (U) (manufactured by TORAY ADVANCED FILM Co., Ltd.), having a thickness of 75 μm with use of a multi-purpose coater (manufactured by Inoue Metalworking Industry Co., Ltd.) under the conditions of drying for 10 minutes in an oven heated to 100° C., and to the resulting coating surface, SR3 (manufactured by OHTSUKI INDUSTRIAL CO., LTD.) having a thickness of 25 μm was bonded as a protective film to produce a laminate of the protective film and the adhesive film 2. A thickness of a layer obtained from the resin coating agent 2 in the adhesive film 2 was 30 μm.

Example 7

The resin coating agent 3 prepared in Example 3 was applied onto a support film Cerapeel HP2 (U) (manufactured by TORAY ADVANCED FILM Co., Ltd.) having a thickness of 75 μm with use of a multi-purpose coater (manufactured by Inoue Metalworking Industry Co., Ltd.) under the conditions of drying for 10 minutes in an oven heated to 100° C., and to the resulting coating surface, SR3 (manufactured by OHTSUKI INDUSTRIAL CO., LTD.) having a thickness of 25 μm was bonded as a protective film to produce a laminate of the protective film and the adhesive film 3. A thickness of a layer obtained from the resin coating agent 3 in the adhesive film 3 was 30 μm.

Example 8

The resin coating agent 4 prepared in Example 4 was applied onto a support film Cerapeel HP2 (U) (manufactured by TORAY ADVANCED FILM Co., Ltd.) having a thickness of 75 μm with use of a bar coater, and dried for 10 minutes in an oven heated to 100° C. To the resulting coating surface, SR3 (manufactured by OHTSUKI INDUSTRIAL CO., LTD.) having a thickness of 25 μm was bonded as a protective film to produce a laminate of the protective film and the adhesive film 4. A thickness of a layer obtained from the resin coating agent 4 in the adhesive film 4 was 30 μm.

Example 9

The laminate of the protective film and the adhesive film 1 produced in Example 5 was cut into pieces having a size of 8 cm square, and two articles obtained by peeling off the protective film from the piece were prepared. Then, the two articles were laminated so that layers obtained from the resin coating agent 1 overlap one another to obtain a laminate having a structure of support film/layer (two layers) obtained from the resin coating agent 1/support film. Lamination was performed under conditions of temperatures of upper and lower heat plates of 90° C., a vacuum time of 20 seconds, an applied pressure of 0.3 MPa and pressuring time of 30 seconds using a vacuum laminator MVLP-500/600 (manufactured by MEIKI CO., LTD.).

Next, another above-mentioned laminate was prepared, and two articles obtained by peeling off one support film of each of the two laminates were prepared. Then, the two articles were laminated so that layers obtained from the resin coating agent 1 overlap one another to obtain a laminate having a structure of support film/layer (four layers) obtained from the resin coating agent 1/support film. Lamination was performed in the same conditions as in the above, and by repeating this lamination, a laminate having a structure of support film/layer (thickness 2 mm) obtained from the resin coating agent 1/support film was prepared.

Next, the support films on both sides of the above-mentioned laminate were peeled off, and "Teflon (registered trademark)" film was bonded to both sides in place of the support film. A temperature of the resulting laminate having a structure, of "Teflon (registered trademark)" film/layer (thickness 2 mm) obtained from the resin coating agent 1/"Teflon (registered trademark)" film was first raised to 200° C. over one hour, and then the laminate was left standing at 200° C. for 2 hours to cure the layer (thickness 2 mm) obtained from the resin coating agent 1. "Teflon (registered trademark)" films on both sides were peeled off from the resulting laminate having a structure of "Teflon (registered trademark)" film/cured product/"Teflon (registered trademark)" film to obtain a cured product 1.

The prepared cured product 1 was cut using a dicing device DAD 3350 (manufactured by DISCO Corporation) to prepare a rectangular parallelepiped of 2 mm wide, 20 mm long and 4 mm high. In a face of 2 mm×20 mm, at a position 10 mm away in a length direction from both sides of 2 mm wide, namely, a central position, a groove of 1.84 mm deep and 300 μm wide was formed in a direction parallel to both sides of 2 mm wide using a dicing device DAD 3350

(manufactured by DISCO Corporation). The resulting block piece provided with a groove was placed on a horizontal seat with the groove up. Next, a single-edged razor blade 99129 (manufactured by FEATHER Safety Razor Co., Ltd.) was fitted in the groove portion of the block piece provided with a groove with a blade portion down, and a weight of 20 g was dropped from a position 3 cm high from a back of the single-edged razor blade to prepare cracks in the groove portion to prepare a test piece 1. The presence or absence of the crack was checked by an optical microscope.

The maximum strength of the prepared test piece 1 was measured by the above-mentioned method, and consequently the maximum strength was 36.0 N.

Then, by the same method, a laminate having a structure of support film/layer (thickness 0.5 mm) obtained from the resin Coating agent 1/support film was prepared. Next, the support films on both sides of the prepared laminate were peeled off, and "Teflon (registered trademark)" film was bonded to both sides in place of the support film. The resulting laminate having a structure of "Teflon (registered trademark)" film/layer (thickness 0.5 mm) obtained from the resin coating agent 1/"Teflon (registered trademark)" film was heated in an oven at 200° C. for 15 minutes to obtain a cured product 1A. The prepared cured product 1A was cut using a dicing device DAD 3350 (manufactured by DISCO Corporation) to prepare a plate-like test piece 1A of 5 mm wide, 50 mm long and 0.5 mm high. The elastic modulus at −40° C. of the prepared plate-like test piece 1A was measured by the above-mentioned method, and consequently the elastic modulus was 13 GPa.

Example 10

A cured product 2 was prepared by the same method as in Example 9 except for changing the adhesive film 1 to the adhesive film 2, and a test piece 2 was prepared by the same method as in Example 9 except for changing the cured product 1 to the cured product 2. Next, the maximum strength of the prepared test piece 2 was measured by the above-mentioned method, and consequently the maximum strength was 30.0 N.

Further, a cured product 2A was prepared by the same method as in Example 9 except for changing the adhesive film 1 to the adhesive film 2, and a plate-like test piece 2A was prepared by the same method as in Example 9 except for changing the cured product 1A to the cured product 2A. Next, the elastic modulus at −40° C. of the prepared plate-like test piece 2A was measured by the above-mentioned method, and consequently the elastic modulus was 11 GPa.

Example 11

A cured product 3 was prepared by the same method as in Example 9 except for changing the adhesive film 1 to the adhesive film 3, and a test piece 3 was prepared by the same method as in Example 9 except for changing the cured product 1 to the cured product 3. Next, the maximum strength of the prepared test piece 3 was measured by the above-mentioned method, and consequently the maximum strength was 33.0 N.

Further, a cured product 3A was prepared by the same method as in Example 9 except for changing the adhesive film 1 to the adhesive film 3, and a plate-like test piece 3A was prepared by the same method as in Example 9 except for changing the cured product 1A to the cured product 3A. Next, the elastic modulus at −40° C. of the prepared plate-like test piece 3A was measured by the above-mentioned method, and consequently the elastic modulus was 13 GPa.

Example 12

A cured product 4 was prepared by the same method as in Example 9 except for changing the adhesive film 1 to the adhesive film 4, and a test piece 4 was prepared by the same method as in Example 9 except for changing the cured product 1 to the cured product 4. Next, the maximum strength of the prepared test piece 4 was measured by the above-mentioned method, and consequently the maximum strength was 38.9 N.

Further, a cured product 4A was prepared by the same method as in Example 9 except for changing the adhesive film 1 to the adhesive film 4, and a plate-like test piece 4A was prepared by the same method as in Example 9 except for changing the cured product 1A to the cured product 4A. Next, the elastic modulus at −40° C. of the prepared plate-like test piece 4A was measured by the above-mentioned method, and consequently the elastic modulus was 13 GPa.

Comparative Example 1

YL 980 (manufactured by Mitsubishi Chemical Corporation, epoxy equivalent weight 185 g/eq) (11.49 g), jER 1009 (manufactured by Mitsubishi Chemical Corporation, epoxy equivalent weight 2719 g/eq) (9.82 g), N-865 (manufactured by DIC Corporation, epoxy equivalent weight 205 g/eq) (11.32 g), 2PZ (manufactured by SHIKOKU CHEMICALS CORPORATION) (0.67 g), SE2050-KNK (manufactured by Admatechs Co., Ltd.) (111.0 g), and PGMEA (5.70 g) were added to a 250 mL polyethylene container, and the resulting mixture was stirred at room temperature for 96 hours on a ball mill stand. Thereafter, using a filter with a retained particle diameter of 10 μm, the resulting mixed liquid was subjected to pressurized filtration to obtain a resin coating agent 5 (T/M=275 g/mol). Viscosity of the resin coating agent 5 was measured at 1 rpm using a viscometer RE105L (manufactured by Toki Sangyo Co., Ltd.), and consequently the viscosity was 280 cP. Further, the viscosity of the resin coating agent 5 at 1 rpm was measured after storing the resin coating agent 5 for 24 hours in a thermo-hygrostat adjusted to a temperature of 25° C. and humidity of 50%, and consequently the viscosity was 280 cP, and changes in viscosity was not found. Moreover, the resin coating agent 5 was stored for 120 hours in a thermo-hygrostat adjusted to a temperature of 25° C. and humidity of 50%, and then the viscosity at 1 rpm was measured, and consequently the viscosity was 280 cP, changes in viscosity was little found, and it was confirmed that the resin coating agent 5 is excellent in storage stability at room temperature.

Comparative Example 2

The polyimide (0.98 g) obtained in Synthetic Example 1, YL 980 (manufactured by Mitsubishi Chemical Corporation, epoxy equivalent weight 185 g/eq) (11.49 g), jER 1009 (manufactured by Mitsubishi Chemical Corporation, epoxy equivalent weight 2719 g/eq) (8.84 g), N-865 (manufactured by DIC Corporation, epoxy equivalent weight 205 g/eq) (11.32 g), 2PZ (manufactured by SHIKOKU CHEMICALS CORPORATION) (0.67 g), SE2050-KNK (manufactured by Admatechs Co., Ltd.) (111.00 g), and PGMEA (5.70 g) were added to a 250 mL polyethylene container, and the resulting mixture was stirred at room temperature for 96 hours on a ball mill stand. Thereafter, using a filter with a retained particle diameter of 10 µm, the resulting mixed liquid was subjected to pressurized filtration to obtain a resin coating agent 6 (T/M=276 g/mol).

Comparative Example 3

YL 980 (manufactured by Mitsubishi Chemical Corporation, epoxy equivalent weight 185 g/eq) (11.49 g), jER 1010 (manufactured by Mitsubishi Chemical Corporation, epoxy equivalent weight 3770 g/eq) (9.82 g), N-865 (manufactured by DIC Corporation, epoxy equivalent weight 205 g/eq) (11.32 g), 2PZ (manufactured by SHIKOKU CHEMICALS CORPORATION) (0.67 g), SE2050-KNK (manufactured by Admatechs Co., Ltd.) (111.00 g), and PGMEA (5.70 g) were added to a 250 mL polyethylene container, and the resulting mixture was stirred at room temperature for 96 hours on a ball mill stand. Thereafter, using a filter with a retained particle diameter of 10 µm, the resulting mixed liquid was subjected to pressurized filtration to obtain a resin coating agent 7 (T/M=278 g/mol).

Comparative Example 4 jER 1009 (manufactured by Mitsubishi Chemical Corporation, epoxy equivalent weight 2719 g/eq) (10.96 g), N-865 (manufactured by DIC Corporation, epoxy equivalent weight 205 g/eq) (12.63 g), SE2050-KNK (manufactured by Admatechs Co., Ltd.) (78.00 g), and PGMEA (15.60 g) were added to a 250 mL polyethylene container, and the resulting mixture was stirred at room temperature for 72 hours on a ball mill stand. Moreover, a microcapsule type curing accelerator NOVACURE HX-3941HP (manufactured by Asahi Kasei E-materials Corporation) (12.81 g) was added, and the resulting mixture was stirred at room temperature for 2 hours on a ball mill stand. Thereafter, using a filter with a retained particle diameter of 10 µm, the resulting mixed liquid was subjected to pressurized filtration to obtain a resin coating agent 8. Viscosity of the resin coating agent 8 was measured at 0.1 rpm using a viscometer RE105L (manufactured by Toki Sangyo Co., Ltd.), and consequently the viscosity was 3200 cP. Further, the viscosity of the resin coating agent 8 at 0.1 rpm was measured after storing the resin coating agent 8 for 24 hours in a thermo-hygrostat adjusted to a temperature of 25° C. and humidity of 50%, and consequently the viscosity was 4030 cP, and a significant increase in viscosity was found. Moreover, the resin coating agent 8 was stored for 48 hours in a thermo-hygrostat adjusted to a temperature of 25° C. and humidity of 50%, and then the viscosity at 0.1 rpm was measured, and consequently the viscosity was 5700 cP and increased, and therefore it was verified that the resin coating agent have a problem with storage stability at room temperature.

Comparative Example 5

The polyimide (9.82 g) obtained in Synthetic Example 1, YL 980 (manufactured by Mitsubishi Chemical Corporation, epoxy equivalent weight 185 g/eq) (11.49 g), N-865 (manufactured by DIC Corporation, epoxy equivalent weight 205 g/eq) (11.32 g), 2PZ (manufactured by SHIKOKU CHEMICALS CORPORATION) (0.67 g), SE2050-KNK (manufactured by Admatechs Co., Ltd.) (111.0 g), and PGMEA (5.70 g) were added to a 250 mL polyethylene container, and the resulting mixture was stirred at room temperature for 96 hours on a ball mill stand. Thereafter, using a filter with a retained particle diameter of 10 µm, the resulting mixed liquid was subjected to pressurized filtration to obtain a resin coating agent 9 (T/M=284 g/mol) in which the amount of the polyimide was about 43 parts by weight and the amount of the epoxy curing agent was about 2.7 parts by weight with respect to 100 parts by weight of the epoxy compound.

Comparative Example 6

The polyimide (4.91 g) obtained in Synthetic Example 1, YL 980 (manufactured by Mitsubishi Chemical Corporation, epoxy equivalent weight 185 g/eq) (6.66 g), jER 1009 (manufactured by Mitsubishi Chemical Corporation, epoxy equivalent weight 2719 g/eq) (4.91 g), NC-3000-H (manufactured by Nippon Kayaku Co., Ltd., epoxy equivalent weight 287 g/eq) (16.15 g), 2PZ (manufactured by SHIKOKU CHEMICALS CORPORATION) (0.67 g), SE2050-KNK (manufactured by Admatechs Co., Ltd.) (111.0 g), and PGMEA (5.70 g) were added to a 250 mL polyethylene container, and the resulting mixture was stirred at room temperature for 96 hours on a ball mill stand. Thereafter, using a filter with a retained particle diameter of 10 µm, the resulting mixed liquid was subjected to pressurized filtration to obtain a resin coating agent 10 (T/M=354 g/mol).

Comparative Example 7

The polyimide (0.88 g) obtained in Synthetic Example 1, YL 980 (manufactured by Mitsubishi Chemical Corporation, epoxy equivalent weight 185 g/eq) (5.88 g), jER 1010 (manufactured by Mitsubishi Chemical Corporation, epoxy equivalent weight 3770 g/eq) (7.79 g), NC-3000-H (manufactured by Nippon Kayaku Co., Ltd., epoxy equivalent weight 287 g/eq) (14.26 g), 2PZ (manufactured by SHIKOKU CHEMICALS CORPORATION) (0.59 g), SE2050-KNK (manufactured by Admatechs Co., Ltd.) (98.00 g), and PGMEA (12.60 g) were added to a 250 mL polyethylene container, and the resulting mixture was stirred at room temperature for 96 hours on a ball mill stand. Thereafter, using a filter with a retained particle diameter of 10 µm, the resulting mixed liquid was subjected to pressurized filtration to obtain a resin coating agent 11 (T/M=352 g/mol).

Comparative Example 8

The resin coating agent 5 prepared in Comparative Example 1 was applied onto a support film Cerapeel HP2 (U) (manufactured by TORAY ADVANCED FILM Co., Ltd.) having a thickness of 75 µm with use of a bar coater, and dried for 10 minutes in an oven heated to 100° C. To the resulting coating surface, SR3 (manufactured by OHTSUKI INDUSTRIAL CO., LTD.) having a thickness of 25 µm was bonded as a protective film to produce a laminate of the protective film and the adhesive film 5. A thickness of a layer obtained from the resin coating agent 5 in the adhesive film 5 was 30 µm.

Comparative Example 9

The resin coating agent 6 prepared in Comparative Example 2 was applied onto a support film Cerapeel HP2 (U) (manufactured by TORAY ADVANCED FILM Co., Ltd.) having a thickness of 75 µm with use of a bar coater, and dried for 10 minutes in an oven heated to 100° C. To the resulting coating surface, SR3 (manufactured by OHTSUKI INDUSTRIAL CO., LTD.) having a thickness of 25 µm was bonded as a protective film to produce a laminate of the protective film and the adhesive film 6. A thickness of a layer obtained from the resin coating agent 6 in the adhesive film 6 was 30 µm.

Comparative Example 10

The resin coating agent 7 prepared in Comparative Example 3 was applied onto a support film Cerapeel HP2 (U) (manufactured by TORAY ADVANCED FILM Co., Ltd.) having a thickness of 75 µm with use of a bar coater, and dried for 10 minutes in an oven heated to 100° C. To the resulting coating surface, SR3 (manufactured by OHTSUKI INDUSTRIAL CO., LTD.) having a thickness of 25 µm was bonded as a protective film to produce a laminate of the protective film and the adhesive film 7. A thickness of a layer obtained from the resin coating agent 7 in the adhesive film 7 was 30 µm.

Comparative Example 11

The resin coating agent 9 prepared in Comparative Example 5 was applied onto a support film Cerapeel HP2 (U) (manufactured by TORAY ADVANCED FILM Co., Ltd.) having a thickness of 75 µm with use of a bar coater, and dried for 10 minutes in an oven heated to 100° C. To the resulting coating surface, SR3 (manufactured by OHTSUKI INDUSTRIAL CO., LTD.) having a thickness of 25 µm was bonded as a protective film to produce a laminate of the protective film and the adhesive film 9. A thickness of a layer obtained from the resin coating agent 9 in the adhesive film 9 was 30 µm.

Comparative Example 12

The resin coating agent 10 prepared in Comparative Example 6 was applied onto a support film Cerapeel HP2 (U) (manufactured by TORAY ADVANCED FILM Co., Ltd.) having a thickness of 75 µm with use of a bar coater, and dried for 10 minutes in an oven heated to 100° C. To the resulting coating surface, SR3 (manufactured by OHTSUKI INDUSTRIAL CO., LTD.) having a thickness of 25 µm was bonded as a protective film to produce a laminate of the protective film and the adhesive film 10. A thickness of a layer obtained from the resin coating agent 10 in the adhesive film 10 was 30 µm.

Comparative Example 13

The resin coating agent 11 prepared in Comparative Example 7 was applied onto a support film Cerapeel HP2 (U) (manufactured by TORAY ADVANCED FILM Co., Ltd.) having a thickness of 75 µm with use of a bar coater, and dried for 10 minutes in an oven heated to 100° C. To the resulting coating surface, SR3 (manufactured by OHTSUKI INDUSTRIAL CO., LTD.) having a thickness of 25 µm was bonded as a protective film to produce a laminate of the protective film and the adhesive film 11. A thickness of a layer obtained from the resin coating agent 11 in the adhesive film 11 was 30 µm.

Comparative Example 14

A cured product 5 was prepared by the same method as in Example 9 except for changing the adhesive film 1 to the adhesive film 5, and a test piece 5 was prepared by the same method as in Example 9 except for changing the cured product 1 to the cured product 5. Next, the maximum strength of the prepared test piece 5 was measured by the above-mentioned method, and consequently the maximum strength was 15.1 N.

Further, a cured product 5A was prepared by the same method as in Example 9 except for changing the adhesive film 1 to the adhesive film 5, and a plate-like test piece 5A was prepared by the same method as in Example 9 except for changing the cured product 1A to the cured product 5A. Next, the elastic modulus at −40° C. of the prepared plate-like test piece 5A was measured by the above-mentioned method, and consequently the elastic modulus was 13 GPa.

Comparative Example 15

A cured product 6 was prepared by the same method as in Example 9 except for changing the adhesive film 1 to the adhesive film 6, and a test piece 6 was prepared by the same method as in Example 9 except for changing the cured product 1 to the cured product 6. Next, the maximum strength of the prepared test piece 6 was measured by the above-mentioned method, and consequently the maximum strength was 14.4 N.

Further, a cured product 6A was prepared by the same method as in Example 9 except for changing the adhesive film 1 to the adhesive film 6, and a plate-like test piece 6A was prepared by the same method as in Example 9 except for changing the cured product 1A to the cured product 6A. Next, the elastic modulus at −40° C. of the prepared plate-like test piece 6A was measured by the above-mentioned method, and consequently the elastic modulus was 13 GPa.

Comparative Example 16

A cured product 7 was prepared by the same method as in Example 9 except for changing the adhesive film 1 to the adhesive film 7, and a test piece 7 was prepared by the same method as in Example 9 except for changing the cured product 1 to the cured product 7. Next, the maximum strength of the prepared test piece 7 was measured by the above-mentioned method, and consequently the maximum strength was 13.9 N.

Further, a cured product 7A was prepared by the same method as in Example 9 except for changing the adhesive film 1 to the adhesive film 7, and a plate-like test piece 7A was prepared by the same method as in Example 9 except for changing the cured product 1A to the cured product 7A. Next, the elastic modulus at −40° C. of the prepared plate-like test piece 7A was measured by the above-mentioned method, and consequently the elastic modulus was 13 GPa.

Comparative Example 17

A cured product 9 was prepared by the same method as in Example 9 except for changing the adhesive film 1 to the adhesive film 9, and a test piece 9 was prepared by the same method as in Example 9 except for changing the cured product 1 to the cured product 9. Next, the maximum strength of the prepared test piece 9 was measured by the above-mentioned method, and consequently the maximum strength was 15.4 N.

Further, a cured product 9A was prepared by the same method as in Example 9 except for changing the adhesive film 1 to the adhesive film 9, and a plate-like test piece 9A was prepared by the same method as in Example 9 except for changing the cured' product 1A to the cured product 9A. Next, the elastic modulus at −40° C. of the prepared plate-like test piece 9A was measured by the above-mentioned method, and consequently the elastic modulus was 13 GPa.

Comparative Example 18

A cured product 10 was prepared by the same method as in Example 9 except for changing the adhesive film 1 to the adhesive film 10, and a test piece 10 was prepared by the same method as in Example 9 except for changing the cured product 1 to the cured product 10. Next, the maximum strength of the prepared test piece 10 was measured by the above-mentioned method, and consequently the maximum strength was 19.6 N.

Further, a cured product 10A was prepared by the same method as in Example 9 except for changing the adhesive film 1 to the adhesive film 10, and a plate-like test piece 10A was prepared by the same method as in Example 9 except for changing the cured product 1A to the cured product 10A. Next, the elastic modulus at −40° C. of the prepared plate-like test piece 10A was measured by the above-mentioned method, and consequently the elastic modulus was 13 GPa.

Comparative Example 19

A cured product 11 was prepared by the same method as in Example 9 except for changing the adhesive film 1 to the adhesive film 11, and a test piece 11 was prepared by the same method as in Example 9 except for changing the cured product 1 to the cured product 11. Next, the maximum strength of the prepared test piece 11 was measured by the above-mentioned method, and consequently the maximum strength was 18.0 N.

Further, a cured product 11A was prepared by the same method as in Example 9 except for changing the adhesive film 1 to the adhesive film 11, and a plate-like test piece 11A was prepared by the same method as in Example 9 except for changing the cured product 1A to the cured product 11A. Next, the elastic modulus at −40° C. of the prepared plate-like test piece 11A was measured by the above-mentioned method, and consequently the elastic modulus was 13 GPa.

Example 13

The polyimide (3.78 g) obtained in Synthetic Example 1, YL 980 (manufactured by Mitsubishi Chemical Corporation, epoxy equivalent weight 185 g/eq) (15.12 g), NC-3000-H (manufactured by Nippon Kayaku Co., Ltd., epoxy equivalent weight 287 g/eq) (15.12 g), jER 1009 (manufactured by Mitsubishi Chemical Corporation, epoxy equivalent weight 2719 g/eq) (28.73 g), jER 1010 (manufactured by Mitsubishi Chemical Corporation, epoxy equivalent weight 3770 g/eq) (11.34 g), 2PZ (manufactured by SHIKOKU CHEMICALS CORPORATION) (1.51 g), SE2050-ENA (manufactured by Admatechs Co., Ltd.) (252.0 g), and carbitol (22.40 g) were added to a 500 mL polyethylene container, and the resulting mixture was stirred at room temperature for 96 hours on a ball mill stand. Thereafter, using a filter with a retained particle diameter of 10 μm, the resulting mixed liquid was subjected to pressurized filtration to obtain a resin coating agent 1B (T/M=511 g/mol).

Example 14

The polyimide (8.64 g) obtained in Synthetic Example 1, YL 980 (manufactured by Mitsubishi Chemical Corporation, epoxy equivalent weight 185 g/eq) (16.85 g), jER 1010 (manufactured by Mitsubishi Chemical Corporation, epoxy equivalent weight 3770 g/eq) (17.28 g), 2PZ (manufactured by SHIKOKU CHEMICALS CORPORATION) (0.43 g), SE2050-ENA (manufactured by Admatechs Co., Ltd.) (144.0 g), and carbitol (12.80 g) were added to a 500 mL polyethylene container, and the resulting mixture was stirred at room temperature for 96 hours on a ball mill stand. Thereafter, using a filter with a retained particle diameter of 10 μm, the resulting mixed liquid was subjected to pressurized filtration to obtain a resin coating agent 2B (T/M=452 g/mol).

Example 15

The resin coating agent 1B prepared in Example 13 was applied onto a support film Cerapeel HP2 (U) (manufactured by TORAY ADVANCED FILM Co., Ltd.) having a thickness of 75 μm with use of a multi-purpose coater (manufactured by Inoue Metalworking Industry Co., Ltd.) under the conditions of drying for 10 minutes in an oven heated to 100° C., and to the resulting coating surface, SR3 (manufactured by OHTSUKI INDUSTRIAL CO., LTD.) having a thickness of 25 μm was bonded as a protective film to produce a laminate of the protective film and the adhesive film 1B. A thickness of a layer obtained from the resin coating agent 1B in the adhesive film 1B was 30 μm.

Example 16

The resin coating agent 2B prepared in Example 14 was applied onto a support film Cerapeel HP2 (U) (manufactured by TORAY ADVANCED FILM Co., Ltd.) having a thickness of 75 μm with use of a multi-purpose coater (manufactured by Inoue Metalworking Industry Co., Ltd.) under the conditions of drying for 10 minutes in an oven heated to 100° C., and to the resulting coating surface, SR3 (manufactured by OHTSUKI INDUSTRIAL CO., LTD.) having a thickness of 25 μm was bonded as a protective film to produce a laminate of the protective film and the adhesive film 2B. A thickness of a layer obtained from the resin coating agent 2B in the adhesive film 2B was 30 μm.

Example 17

A cured product 1B was prepared by the same method as in Example 9 except for changing the adhesive film 1 to the adhesive film 1B, and a test piece 1B was prepared by the same method as in Example 9 except for changing the cured product 1 to the cured product 1B. Next, the maximum strength of the prepared test piece 1B was measured by the above-mentioned method, and consequently the maximum strength was 34.3 N.

Further, a cured product 1B was prepared by the same method as in Example 9 except for changing the adhesive film 1 to the adhesive film 1B, and a plate-like test piece 1B was prepared by the same method as in Example 9 except for changing the cured product 1A to the cured product 1B. Next, the elastic modulus at −40° C. of the prepared plate-like test piece 1B was measured by the above-mentioned method, and consequently the elastic modulus was 13 GPa.

Example 18

A cured product 2B was prepared by the same method as in Example 9 except for changing the adhesive film 1 to the adhesive film 2B, and a test piece 2B was prepared by the same method as in Example 9 except for changing the cured product 1 to the cured product 2B. Next, the maximum strength of the prepared test piece 2B was measured by the above-mentioned method, and consequently the maximum strength was 29.0 N.

Further, a cured product 2B was prepared by the same method as in Example 9 except for changing the adhesive film 1 to the adhesive film 2B, and a plate-like test piece 2B was prepared by the same method as in Example 9 except for changing the cured product 1A to the cured product 2B. Next, the elastic modulus at −40° C. of the prepared plate-like test piece 2B was measured by the above-mentioned method, and consequently the elastic modulus was 13 GPa.

Example 19

The resin coating agent 2 prepared in Example 2 was applied onto a 12-inch wafer with use of a slit coater, and a substrate was dried at 80° C. for 10 minutes by a hot plate. A film thickness was measured at points which are 5 cm, 10 cm, 15 cm, 20 cm, and 25 cm away from a start point of application on a straight line in the same direction as an application direction which passes through the center of the 300 mm wafer, and consequently the measured thicknesses are within 36±1 μm, and it was confirmed that a coating having excellent in-plane uniformity could be formed. The resulting substrate was fired for 15 minutes in an oven set at 200° C. to form a cured film on the wafer. It was visually confirmed that there was no peeling between the wafer and the cured film.

Example 20

The resin coating agent 4 prepared in Example 4 was applied onto a 12-inch wafer with use of a slit coater, and a substrate was dried at 80° C. for 10 minutes by a hot plate. A film thickness was measured at points which are 5 cm, 10 cm, 15 cm, 20 cm, and 25 cm away from a start point of application on a straight line in the same direction as an application direction which passes through the center of the 300 mm wafer, and consequently the measured thicknesses are within 25±1 μm, and it was confirmed that a coating having excellent in-plane uniformity could be formed. The resulting substrate was fired for 15 minutes in an oven set at 200° C. to form a cured film on the wafer. It was visually confirmed that there was no peeling between the wafer and the cured film.

Example 21

The resin coating agent 2 prepared in Example 2 was applied, with use of a slit coater, onto a 12-inch wafer with copper pillars of 70 μm in diameter (height 20 μm) arranged with a 100 μm pitch, and a substrate was dried at 80° C. for 10 minutes by a hot plate. A film thickness of an area without a copper pillar was 41 μm, and it was confirmed that a height difference between an area with a copper pillar and an area without a copper pillar was less than 1 μm. The resulting substrate was fired for 15 minutes in an oven set at 200° C. to form a cured film on the wafer. It was visually confirmed that there was no peeling between the wafer and the cured film.

Example 22

An article obtained by peeling off the protective film from the laminate of the protective film and the adhesive film 2 produced in Example 6 was prepared, and the article and a chip having a size of 1 cm×1 cm (a chip in which a thickness of a silicon wafer was 625 μm and copper pillars of 25 μm in diameter (height 25 μm) were arranged with a 50 μm pitch were arranged) were laminated so that a layer obtained from the resin coating agent 2 prepared in Example 2 and a surface having the copper pillars formed overlap one another to prepare a substrate laminate 1. Lamination was performed under conditions of temperatures of upper and lower heat plates of 90° C., a vacuum time of 20 seconds, an applied pressure of 0.3 MPa and pressuring time of 30 seconds using a vacuum laminator MVLP-500/600 (manufactured by MEIKI CO., LTD.). Next, an article obtained by peeling off the protective film from the laminate of the protective film and the adhesive film 2 produced in Example 6 was prepared, and the article and a glass epoxy substrate (thickness 10 mm) having a size of 15 mm×15 mm were laminated so that a layer obtained from the resin coating agent 2 prepared in Example 2 and the glass epoxy substrate overlap one another to prepare a substrate laminate 2. Lamination was performed under conditions of temperatures of upper and lower heat plates of 90° C., a vacuum time of 20 seconds, an applied pressure of 0.3 MPa and pressuring time of 30 seconds using a vacuum laminator MVLP-500/600 (manufactured by MEIKI CO., LTD.).

Next, an article obtained by peeling off the support film from the substrate laminate 1, and an article obtained by peeling off the support film from the substrate laminate 2 were respectively prepared, and the two articles were laminated so that layers obtained from the resin coating agent 2 prepared in Example 2 overlap one another to prepare a substrate laminate 3. Lamination was performed under conditions of temperatures of upper and lower heat plates of 90° C., a vacuum time of 20 seconds, an applied pressure of 0.3 MPa and pressuring time of 30 seconds using a vacuum laminator MVLP-500/600 (manufactured by MEIKI CO., LTD.). The prepared substrate laminate 3 was heated at 180° C. for 1 hour to prepare a substrate laminate 4. The prepared substrate laminate 4 was left standing for 168 hours in a thermo-hygrostat (manufactured by Kusumoto Chemicals, Ltd., FX214P) maintained at a temperature of 85° C. and a humidity of 85% to obtain a substrate laminate 5. A step of leaving the obtained substrate laminate 5 standing in a thermal shock chamber (manufactured by ESPEC CORPORATION, TSE-11-A) at a temperature of −55° C. for 30 minutes and at a temperature of 125° C. for 30 minutes was repeated 1000 times to obtain a substrate laminate 6. A cross section of the substrate laminate 6 was observed with a scanning electron microscope (JSM-6510A manufactured by JEOL Ltd.), and it was confirmed that there was no gap between the layer obtained from the resin coating agent 2 and a silicon wafer portion of the chip. Further, it was confirmed that there was no gap between the layer obtained from the resin coating agent 2 and a copper pillar portion.

Example 23

An article obtained by peeling off the protective film from the laminate of the protective film and the adhesive film 2 produced in Example 6 was prepared, and the article's layer obtained from the resin coating agent 2 prepared in Example 2 was laminated on a copper plate (thickness 15 mm) having a size of 1 cm×1 cm to prepare a substrate laminate 7. Lamination was performed under conditions of temperatures of upper and lower heat plates of 90° C., a vacuum time of 20 seconds, an applied pressure of 0.3 MPa and pressuring time of 30 seconds using a vacuum laminator MVLP-500/600 (manufactured by MEIKI CO., LTD.). Next, an article obtained by peeling off the protective film from the laminate of the protective film and the adhesive film 2 produced in Example 6 was prepared, and the article and a glass epoxy substrate (thickness 10 mm) having a size of 15 mm×15 mm were laminated so that a layer obtained from the resin coating agent 2 prepared in Example 2 and the glass epoxy substrate overlap one another to prepare a substrate laminate 8. Lamination was performed under conditions of temperatures of upper and lower heat plates of 90° C., a vacuum duration of 20 seconds, an applied pressure of 0.3 MPa and pressuring time of 30 seconds using a vacuum laminator MVLP-500/600 (manufactured by MEIKI CO., LTD.).

Next, an article obtained by peeling off the support film from the substrate laminate 7, and an article obtained by peeling off the support film from the substrate laminate 8 were respectively prepared, and the two articles were laminated so that layers obtained from the resin coating agent 2 prepared in Example 2 overlap one another to prepare a substrate laminate 9. Lamination was performed under conditions of temperatures of upper and lower heat plates of 90° C., a vacuum time of 20 seconds, an applied pressure of 0.3 MPa and pressuring time of 30 seconds using a vacuum laminator MVLP-500/600 (manufactured by MEIKI CO., LTD.). The prepared substrate laminate 9 was heated at 180° C. for 1 hour to prepare a substrate laminate 10. A step of leaving the prepared substrate laminate 10 standing in, a thermal shock chamber (manufactured by ESPEC CORPORATION, TSE-11-A) at a temperature of −55° C. for 30 minutes and at a temperature of 125° C. for 30 minutes was repeated 1000 times, and it was visually confirmed that the copper plate was bonded.

Example 24

An article obtained by peeling off the protective film from a laminate (thickness of the layer obtained from the resin coating agent 2: 50 μm) of the protective film and the adhesive film 2 produced by the same method as in Example 6 was prepared, and the article and a TEG chip provided with a copper pillar bump (manufactured by WALTS CO., LTD., WALTS-TEG CC80-0101JY (SiN) ModelI) were laminated so that a layer obtained from the resin coating agent 2 and a surface having the copper pillar bumps formed thereon overlap one another to prepare a substrate laminate 11. Lamination was performed under conditions of temperatures of upper and lower heat plates of 90° C., a vacuum time of 20 seconds, an applied pressure of 0.3 MPa and pressuring time of 30 seconds using a vacuum laminator MVLP-500/600 (manufactured by MEIKI CO., LTD.) Then, the support film was peeled off to prepare an evaluation chip provided with the adhesive composition. Thereafter, the evaluation chip was bonded to a substrate (manufactured by WALTS CO., LTD., WALTS-KIT CC80-0103JY [MAP] ModelI (Cu+OSP specification)) which is an adherend by flip-chip bonding using a flip-chip bonding apparatus (manufactured by Toray Engineering Co., Ltd., FC-3000WS) to obtain a semiconductor device. In regard to the conditions of flip-chip bonding, a substrate was placed on a bonding stage heated to 140° C., and a chip was temporarily press-bonded under conditions of a temperature of 140° C., a pressure of 150 N/chip and a time of 1 second and then formally press-bonded under conditions of a temperature of 250° C., a pressure of 150° C. and a time of 5 seconds. A step of leaving the obtained semiconductor device standing in a thermal shock chamber (manufactured by ESPEC CORPORATION, TSE-11-A) at a temperature of −55° C. for 30 minutes and at a temperature of 125° C. for 30 minutes was repeated 500 times, and it was confirmed that the semiconductor device was conducting.

Composition of the resin coating agents is summarized in Table 1, and the maximum strengths and the elastic moduli at −40° C. of the test pieces are summarized in Table 2.

TABLE 1

| | | | Example 1 | Example 2 | Example 3 | Example 4 | Comparative Example 1 | Comparative Example 2 | Comparative Example 3 |
|---|---|---|---|---|---|---|---|---|---|
| | | Resin Coating Agent | 1 | 2 | 3 | 4 | 5 | 6 | 7 |
| (A) | Polyimide of Synthetic Example 1 | Weight (g) | 5.83 | 51.45 | 44.10 | 3.15 | 0.00 | 0.98 | 0.00 |
| | | Ratio of Component in Nonvolatile Organic Component (wt %) | 17.5 | 30.0 | 30.0 | 10.0 | 0.0 | 2.9 | 0.0 |
| (B) | EPOTOTE PG-207GS (liquid epoxy compound) | Weight (g) | 9.32 | 0.00 | 0.00 | 0.00 | 0.00 | 0.00 | 0.00 |
| | | Ratio of Component in Nonvolatile Organic Component (wt %) | 28.0 | 0.0 | 0.0 | 0.0 | 0.0 | 0.0 | 0.0 |
| | jER1010 | Weight (g) | 17.48 | 0.00 | 0.00 | 18.90 | 0.00 | 0.00 | 9.82 |
| | | Ratio of Component in Nonvolatile Organic Component (wt %) | 52.5 | 0.0 | 0.0 | 60.0 | 0.0 | 0.0 | 29.5 |
| | YL980 (liquid epoxy compound) | Weight (g) | 0.00 | 65.17 | 55.86 | 8.82 | 11.49 | 11.49 | 11.49 |
| | | Ratio of Component in Nonvolatile Organic Component (wt %) | 0.0 | 38.0 | 38.0 | 28.0 | 34.5 | 34.5 | 34.5 |
| | jER1009 | Weight (g) | 0.00 | 51.45 | 44.10 | 0.00 | 9.82 | 8.84 | 0.00 |
| | | Ratio of Component in Nonvolatile Organic Component (wt %) | 0.0 | 30.0 | 30.0 | 0.0 | 29.5 | 26.6 | 0.0 |
| | N865 | Weight (g) | 0.00 | 0.00 | 0.00 | 0.00 | 11.32 | 11.32 | 11.32 |
| | | Ratio of Component in Nonvolatile Organic Component (wt %) | 0.0 | 0.0 | 0.0 | 0.0 | 34.0 | 34.0 | 34.0 |
| | NC3000H | Weight (g) | 0.00 | 0.00 | 0.00 | 0.00 | 0.00 | 0.00 | 0.00 |
| | | Ratio of Component in Nonvolatile Organic Component (wt %) | 0.0 | 0.0 | 0.0 | 0.0 | 0.0 | 0.0 | 0.0 |
| (C) | 2PZ | Weight (g) | 0.67 | 3.43 | 2.94 | 0.63 | 0.67 | 0.67 | 0.67 |
| | | Ratio of Component | 2.0 | 2.0 | 2.0 | 2.0 | 2.0 | 2.0 | 2.0 |

TABLE 1-continued

|  |  |  | | | | | | | |
|---|---|---|---|---|---|---|---|---|---|
|  | NOVACURE HX-3941HP | Ratio of Component in Nonvolatile Organic Component (wt %) | | | | | | | |
|  |  | Weight (g) | 0.00 | 0.00 | 0.00 | 0.00 | 0.00 | 0.00 | 0.00 |
|  |  | Ratio of Component in Nonvolatile Organic Component (wt %) | 0.0 | 0.0 | 0.0 | 0.0 | 0.0 | 0.0 | 0.0 |
| (D) | Inorganic Particle | Weight (g) | 111.0 | 455.0 | 490.0 | 105.0 | 111.0 | 111.0 | 111.0 |
|  |  | Ratio of Component in Nonvolatile Organic Component (wt %) | 70.0 | 65.0 | 70.0 | 70.0 | 70.0 | 70.0 | 70.0 |
| (E) | Organic Solvent | Weight (g) | 5.70 | 73.50 | 63.00 | 13.50 | 5.70 | 5.70 | 5.70 |

|  |  |  | Comparative Example 4 | Comparative Example 5 | Comparative Example 6 | Comparative Example 7 | Example 13 | Example 14 |
|---|---|---|---|---|---|---|---|---|
|  |  | Resin Coating Agent | 8 | 9 | 10 | 11 | 1B | 2B |
| (A) | Polyimide of Synthetic Example 1 | Weight (g) | 0.00 | 9.82 | 4.91 | 0.88 | 3.78 | 8.64 |
|  |  | Ratio of Component in Nonvolatile Organic Component (wt %) | 0.0 | 29.5 | 14.7 | 3.0 | 5.0 | 20.0 |
| (B) | EPOTOTE PG-207GS (liquid epoxy compound) | Weight (g) | 0.00 | 0.00 | 0.00 | 0.00 | 0.00 | 0.00 |
|  |  | Ratio of Component in Nonvolatile Organic Component (wt %) | 0.0 | 0.0 | 0.0 | 0.0 | 0.0 | 0.0 |
|  | jER1010 | Weight (g) | 0.00 | 0.00 | 0.00 | 7.79 | 11.34 | 17.28 |
|  |  | Ratio of Component in Nonvolatile Organic Component (wt %) | 0.0 | 0.0 | 0.0 | 26.5 | 15.0 | 40.0 |
|  | YL980 (liquid epoxy compound) | Weight (g) | 0.00 | 11.49 | 6.66 | 5.88 | 15.12 | 16.85 |
|  |  | Ratio of Component in Nonvolatile Organic Component (wt %) | 0.0 | 34.5 | 20.0 | 20.0 | 20.0 | 39.0 |
|  | jER1009 | Weight (g) | 10.96 | 0.00 | 4.91 | 0.00 | 28.73 | 0.00 |
|  |  | Ratio of Component in Nonvolatile Organic Component (wt %) | 30.1 | 0.0 | 14.7 | 0.0 | 38.0 | 0.0 |
|  | N865 | Weight (g) | 12.63 | 11.32 | 0.00 | 0.00 | 0.00 | 0.00 |
|  |  | Ratio of Component in Nonvolatile Organic Component (wt %) | 34.7 | 34.0 | 0.0 | 0.0 | 0.0 | 0.0 |
|  | NC3000H | Weight (g) | 0.00 | 0.00 | 16.15 | 14.26 | 15.12 | 0.00 |
|  |  | Ratio of Component in Nonvolatile Organic Component (wt %) | 0.0 | 0.0 | 48.5 | 48.5 | 20.0 | 0.0 |
| (C) | 2PZ | Weight (g) | 0.00 | 0.67 | 0.67 | 0.59 | 1.51 | 0.43 |
|  |  | Ratio of Component in Nonvolatile Organic Component (wt %) | 0.0 | 2.0 | 2.0 | 2.0 | 2.0 | 1.0 |
|  | NOVACURE HX-3941HP | Weight (g) | 12.81 | 0.00 | 0.00 | 0.00 | 0.00 | 0.00 |
|  |  | Ratio of Component in Nonvolatile Organic Component (wt %) | 35.2 | 0.0 | 0.0 | 0.0 | 0.0 | 0.0 |
| (D) | Inorganic Particle | Weight (g) | 78.0 | 111.0 | 111.0 | 98.0 | 252.0 | 144.0 |
|  |  | Ratio of Component in Nonvolatile Organic Component (wt %) | 60.0 | 70.0 | 70.0 | 70.0 | 70.0 | 70.0 |
| (E) | Organic Solvent | Weight (g) | 15.60 | 5.70 | 5.70 | 12.60 | 22.40 | 12.80 |

TABLE 2

|  | Resin Coating Agent | Adhesive Film | T/M of Resin Coating Agent Used (g/mol) | Maximum Strength (N) | Elastic Modulus (GPa) |
|---|---|---|---|---|---|
| Example 9 | 1 | 1 | 970 | 36.0 | 13 |
| Example 10 | 2 | 2 | 462 | 30.0 | 11 |
| Example 11 | 3 | 3 | 462 | 33.0 | 13 |
| Example 12 | 4 | 4 | 598 | 38.9 | 13 |
| Comparative Example 14 | 5 | 5 | 275 | 15.1 | 13 |
| Comparative Example 15 | 6 | 6 | 276 | 14.4 | 13 |
| Comparative Example 16 | 7 | 7 | 278 | 13.9 | 13 |
| Comparative Example 17 | 9 | 9 | 284 | 15.4 | 13 |
| Comparative Example 18 | 10 | 10 | 354 | 19.6 | 13 |
| Comparative Example 19 | 11 | 11 | 352 | 18.0 | 13 |
| Example 17 | 1B | 1B | 511 | 34.3 | 13 |
| Example 18 | 2B | 2B | 452 | 29.0 | 13 |

The invention claimed is:

1. An adhesive composition comprising a polyimide (A), a polyfunctional epoxy compound (B), an epoxy curing agent (C), and inorganic particles (D), wherein the polyimide (A) has at least one functional group capable of reacting with an epoxy group on its side chain, the polyfunctional epoxy compound (B) contains a liquid epoxy compound and a bisphenol A epoxy resin having an epoxy equivalent weight of 1000 or more and 7000 or less, the epoxy curing agent (C) is an imidazole-based curing agent,
- the ratio of the polyimide (A) in a nonvolatile organic component is 17.5 wt % or more and 30 wt % or less,
- the ratio of the liquid epoxy compound in the nonvolatile organic component is 20 wt % or more and 50 wt % or less,
- the ratio of the bisphenol A epoxy resin in the nonvolatile organic component is 30 wt % or more and 70 wt % or less,
- the ratio of the epoxy curing agent (C) in the nonvolatile organic component is 1.0 wt % or more and 10 wt % or less, and
- T/M is 400 or more and 8000 or less when the total number of grams of the nonvolatile organic component is denoted by T, and the number of moles of epoxy groups in the nonvolatile organic component is denoted by M.

2. The adhesive composition according to claim 1, wherein the polyimide (A) has a structure represented by a general formula (2) or a general formula (3), has at least one functional group capable of reacting with an epoxy group on its side chain, and has a structure represented by a general formula (1) as R4 in the general formula (2) or the general formula (3) in an amount of 5 wt % or more and 15 wt % or less with respect to the total amount of polymers:

[Chemical Formula 1]

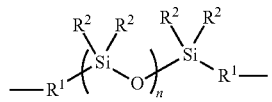

(1)

in which $R^1$ is a divalent hydrocarbon group, $R^2$ is a monovalent hydrocarbon group, $R^1$ and $R^2$ having different structures may be contained in a molecule of the polyimide, or $R^1$ and $R^2$ having different structures may be contained in different polyimide molecules, and n represents an integer of 1 to 10,

[Chemical Formula 2]

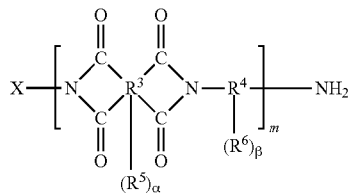

(2)

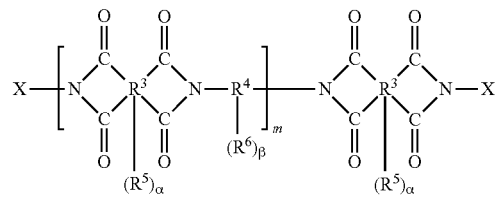

(3)

in which $R^3$ is a tetra- to 14-valent organic group, $R^4$ is a di- to 12-valent organic group, at least one of $R^3$ and $R^4$ contains at least one group selected from the group consisting of a 1,1,1,3,3,3-hexafluoropropyl group, an isopropyl group, an ether group, a thioether group and a $SO_2$ group, $R^5$ and $R^6$ each represent an organic group having at least one group selected from the group consisting of a phenolic hydroxyl group, a sulfonic acid group and a thiol group. $R^3$ to $R^6$ having different structures may be contained in a molecule of the polyimide, or $R^3$ to $R^6$ having different structures may be contained in different polyimide molecules. X represents a monovalent organic group: m is 8 to 200, α and β each represent an integer of 0 to 10 and α+β is an integer of 0 to 10; however, 20 to 90% of the structural units whose repeating number is m show α+β=1 to 10.

3. The adhesive composition according to claim 2, wherein n in the general formula (1) is an integer of 1 to 2.

4. The adhesive composition according to claim 1, wherein the content of the inorganic particles (D) in a nonvolatile component is 50 wt % or more and 80 wt % or less.

5. The adhesive composition according to claim 1, wherein the elastic modulus at −40° C. of the cured adhesive composition is 10 GPa or more and 15 GPa or less.

6. The adhesive composition according to claim 1, wherein the maximum strength at 23° C. of the cured adhesive composition is 28 N or more.

7. An adhesive film having a layer composed of the adhesive composition according to claim 1, and a support film.

8. A substrate provided with the adhesive composition having a layer composed of the adhesive composition according to claim 1, and a substrate.

9. A semiconductor device having a layer composed of the adhesive composition according to claim 1.

10. A method for producing a semiconductor device in which the adhesive composition according to claim 1 is interposed between a first circuit member and a second circuit member, and the first circuit member is electrically connected to the second circuit member by heating/applying pressure to the adhesive composition.

* * * * *